United States Patent
Park et al.

(10) Patent No.: US 10,978,343 B2
(45) Date of Patent: Apr. 13, 2021

(54) INTERCONNECT STRUCTURE HAVING FULLY ALIGNED VIAS

(71) Applicant: International Business Machines Corporation, Armonk, NY (US)

(72) Inventors: Chanro Park, Clifton Park, NY (US); Nicholas Anthony Lanzillo, Troy, NY (US); Christopher J. Penny, Saratoga Springs, NY (US); Lawrence A. Clevenger, Saratoga Springs, NY (US); Balasubramanian Pranatharthiharan, Watervliet, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/542,532

(22) Filed: Aug. 16, 2019

(65) Prior Publication Data

US 2021/0050260 A1    Feb. 18, 2021

(51) Int. Cl.
*H01L 21/768* (2006.01)
*H01L 21/311* (2006.01)
(Continued)

(52) U.S. Cl.
CPC .. *H01L 21/76897* (2013.01); *H01L 21/31116* (2013.01); *H01L 21/76802* (2013.01);
(Continued)

(58) Field of Classification Search
CPC ......... H01L 21/76897; H01L 21/76885; H01L 21/76802
See application file for complete search history.

(56) References Cited

U.S. PATENT DOCUMENTS

| 6,034,882 | A | 3/2000 | Johnson et al. |
| 6,909,153 | B2 | 6/2005 | Ludwig et al. |

(Continued)

FOREIGN PATENT DOCUMENTS

| CN | 1395307 A | 2/2003 |
| CN | 1691339 A | 11/2005 |

(Continued)

OTHER PUBLICATIONS

Briggs et al., "Fully Aligned Via Integration for Extendibility of Interconnects to Beyond the 7 nm Node," 2017 IEEE International Electron Devices Meeting (IEDM). IEEE, 2017, pp. 338-341.

(Continued)

*Primary Examiner* — William Coleman
(74) *Attorney, Agent, or Firm* — Cantor Colburn LLP; Randall Bluestone

(57) ABSTRACT

An interconnect structure includes an interlayer dielectric (ILD) having a cavity extending therethrough along a first direction. A first electrically conductive strip is formed on a substrate and within the cavity. The first electrically conductive strip extends along the first direction and across an upper surface of the substrate. A second electrically conductive strip is on an upper surface of the ILD and extends along a second direction opposite the first direction. A fully aligned via (FAV) extends between the first and second electrically conductive strips such that all sides of the FAV are co-planar with opposing sides of the first electrically conductive strip and opposing sides of the second electrically conductive strip thereby providing a FAV that is fully aligned with the first electrically conductive strip and the second electrically conductive strip.

25 Claims, 21 Drawing Sheets

(51) Int. Cl.
*H01L 23/528* (2006.01)
*H01L 23/522* (2006.01)
*H01L 21/3213* (2006.01)
*H01L 21/3105* (2006.01)

(52) U.S. Cl.
CPC .. *H01L 21/76877* (2013.01); *H01L 21/76885* (2013.01); *H01L 23/528* (2013.01); *H01L 23/5226* (2013.01); H01L 21/31053 (2013.01); H01L 21/32136 (2013.01); H01L 21/32139 (2013.01); H01L 21/76819 (2013.01)

(56) References Cited

U.S. PATENT DOCUMENTS

| | | | |
|---|---|---|---|
| 8,299,625 B2 | 10/2012 | Ponoth et al. | |
| 8,497,182 B2 | 7/2013 | Lung | |
| 8,975,138 B2 * | 3/2015 | Chandhok | H01L 21/76883 438/270 |
| 9,209,077 B2 | 12/2015 | Myers et al. | |
| 9,613,861 B2 | 4/2017 | Anderson et al. | |
| 9,666,451 B2 | 5/2017 | Wallace et al. | |
| 9,793,163 B2 | 10/2017 | Bristol et al. | |
| 9,953,865 B1 | 4/2018 | Briggs et al. | |
| 10,177,028 B1 | 1/2019 | Licausi et al. | |
| 10,204,830 B2 | 2/2019 | Wallace et al. | |
| 10,515,896 B2 | 12/2019 | Yu et al. | |
| 2013/0069244 A1 | 3/2013 | Blatchford | |
| 2018/0040510 A1 | 2/2018 | Briggs et al. | |

FOREIGN PATENT DOCUMENTS

| | | |
|---|---|---|
| CN | 102751304 A | 10/2012 |
| CN | 109427655 A | 3/2019 |

OTHER PUBLICATIONS

International Search Report and Written Opinion for International Application No. PCT/IB2020/057435; Application filed Aug. 6, 2020; dated Nov. 20, 2020 (12 pages).

* cited by examiner

INTERCONNECT STRUCTURE HAVING FULLY ALIGNED VIAS

BACKGROUND

The present invention generally relates to fabrication methods and resulting semiconductor-based integrated circuits (ICs). More specifically, the present invention relates to methods and resulting interconnect structures of ICs having fully aligned vias.

ICs commonly use metal interconnect structures (or "lines") to connect semiconductor devices such as, for example, transistors, on the ICs. These interconnect structures are typically formed using an additive damascene process or dual damascene process, in which a dielectric layer is patterned to include openings therein. A conductive metal, for example, copper (Cu) is subsequently deposited within the openings and thereafter any conductive metal that is located outside the openings is removed via a planarization process.

SUMMARY

According to a non-limiting embodiment of the invention, an interconnect structure includes an interlayer dielectric (ILD) having a cavity extending therethrough along a first direction. A first electrically conductive strip is formed on a substrate and within the cavity. The first electrically conductive strip extends along the first direction and across an upper surface of the substrate. A second electrically conductive strip is on an upper surface of the ILD and extends along a second direction opposite the first direction. A fully aligned via (FAV) extends between the first and second electrically conductive strips such that all sides of the FAV are co-planar with opposing sides of the first electrically conductive strip and opposing sides of the second electrically conductive strip thereby providing a FAV that is fully aligned with the first electrically conductive strip and the second electrically conductive strip.

According to another non-limiting embodiment of the invention, a method of fabricating an interconnect structure comprises forming a first electrically conductive strip that extends along a first direction on an upper surface of a substrate, and depositing an interlayer dielectric (ILD) material on the substrate to cover the first electrically conductive strip. The method further comprises etching the ILD material to expose an upper surface of the first electrically conductive strip, and forming a second electrically conductive strip on an upper surface of the ILD material so that the second electrically conductive strip extends along a second direction opposite the first direction and across the first electrically conductive strip. The method further comprises recessing exposed portions of the first electrically conductive strip located on opposing sides of the second electrically conductive strip while preserving a covered portion of the first electrically conductive strip covered by the second electrically conductive strip to form a fully aligned via (FAV) between the first electrically conductive strip and the second electrically conductive strip.

According to yet another non-limiting embodiment of the invention, a method of forming an interconnect structure comprises forming a plurality of first-layer electrically conductive strips that extend along a first direction on an upper surface of a substrate, and depositing an interlayer dielectric material on the substrate to cover the first-layer electrically conductive strips. The method further comprises etching the ILD to expose an upper surface of the first-layer electrically conductive strips, and forming a plurality of second-layer electrically conductive strips on an upper surface of the ILD so that the second-layer electrically conductive strips extend along a second direction opposite the first direction and across the first-layer electrically conductive strips. The method further comprises recessing exposed portions of the first-layer electrically conductive strips located on opposing sides of each of the second-layer electrically conductive strips while preserving a covered portion of the first-layer electrically conductive strips covered by the second-layer electrically conductive strips to form a plurality of fully aligned vias (FAVs) between the first-layer electrically conductive strips and the second-layer electrically conductive strips.

According to another non-limiting embodiment of the invention, an interconnect structure comprises an interlayer dielectric (ILD) on a substrate. The ILD has a plurality of cavities extending through the substrate along a first direction. The interconnect structure further includes a plurality of first-layer electrically conductive strips and a plurality of second-layer electrically conductive strips. Each first-layer electrically conductive strip is formed on the substrate and within a respective cavity among the plurality of cavities. The first-layer electrically conductive strips extend along the first direction and across an upper surface of the substrate. The second-layer electrically conductive strips are formed on an upper surface of the ILD, and extend along a second direction opposite the first direction. The interconnect structure further includes a plurality of fully aligned vias (FAVs). Each FAV extends between a respective first-layer electrically conductive strip and a respective second-layer electrically conductive strip. All sides of a given FAV are co-planar with opposing sides of the respective first-layer electrically conductive strip and opposing sides of the respective second-layer electrically conductive strip such that each FAV among the plurality of FAVs is fully aligned with the first and second-layer electrically conductive strips.

According to another non-limiting embodiment of the invention, an interconnect structure comprises an interlayer dielectric (ILD) on a substrate. The ILD has a plurality of cavities extending therethrough along a first direction. A plurality of first-layer electrically conductive strips are formed on the substrate. Each first-layer electrically conductive strip is located within a respective cavity among the plurality of cavities, and extends across an upper surface of the substrate along the first direction. A plurality of second-layer electrically conductive strips are formed on an upper surface of the ILD and extend along a second direction opposite the first direction. A plurality of fully aligned vias (FAVs) extend between a respective first-layer electrically conductive strip and a respective second-layer electrically conductive strip. The first-layer of electrically conductive strips includes at least one recessed electrically conductive strip having a step portion formed in the upper surface and adjacent to a given FAV contacting the upper surface of the at least one recessed electrically conductive strip.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-9 depict a process flow for forming an interconnect structure according to embodiments of the present invention, in which:

FIG. 1 depicts an intermediate interconnect structure after an initial set of fabrication operations according to a non-limiting embodiment of the invention;

FIG. 2 depicts the interconnect structure following patterning of a first hardmask layer according to a non-limiting embodiment of the invention;

FIG. 3 depicts the interconnect structure after transferring the pattern into a lower metal layer to form a lower metal strip according to a non-limiting embodiment of the invention;

FIG. 4 depicts the interconnect structure following deposition of an interlayer dielectric that surrounds the lower metal strip according to a non-limiting embodiment of the invention;

FIG. 5 depicts the interconnect structure following deposition of an upper metal layer on an upper surface of the interlayer dielectric according to a non-limiting embodiment of the invention;

FIG. 6 depicts the interconnect structure following patterning of a second hardmask layer formed on an upper surface of the upper metal layer according to a non-limiting embodiment of the invention;

FIG. 7 depicts the interconnect structure after transferring the pattern into the upper metal layer to form an upper metal strip according to a non-limiting embodiment of the invention;

FIG. 8 depicts the interconnect structure after recessing exposed portions of the lower metal strip below the interlayer dielectric according to a non-limiting embodiment of the invention; and FIG. 9 depicts the interconnect structure having a fully aligned via interposed between the lower metal strip and the upper metal strip according to a non-limiting embodiment of the invention.

FIGS. 10-21 depict a process flow for forming an interconnect structure according to embodiments of the present invention, in which:

FIG. 10 depicts an intermediate interconnect structure after an initial set of fabrication operations according to a non-limiting embodiment of the invention;

FIG. 11 depicts the interconnect structure after patterning of a first hardmask layer and transferring the pattern into a lower metal layer to form a plurality of lower metal strips according to a non-limiting embodiment of the invention;

FIG. 12 depicts the interconnect structure after performing an etching process to etch portions of the metal strips;

FIG. 13 depicts the interconnect structure after removing remaining portions of the second hardmask layer according to a non-limiting embodiment of the invention;

FIG. 14 depicts the interconnect structure following deposition of an interlayer dielectric that surrounds the lower metal strips according to a non-limiting embodiment of the invention;

FIG. 15 depicts the interconnect structure following deposition of an upper metal layer on an upper surface of the interlayer dielectric according to a non-limiting embodiment of the invention;

FIG. 16 depicts the interconnect structure after patterning a third hardmask layer deposited on an upper surface of the upper metal layer according to a non-limiting embodiment of the invention;

FIG. 17 depicts the interconnect structure after transferring the pattern into the upper metal layer to form a plurality of upper metal strips according to a non-limiting embodiment of the invention;

FIG. 18 depicts the interconnect structure after recessing exposed portions of the lower metal strips below the interlayer dielectric according to a non-limiting embodiment of the invention;

FIG. 19 depicts the interconnect structure having a plurality of fully aligned vias interposed between the lower metal strips and the upper metal strips according to a non-limiting embodiment of the invention;

FIG. 20 depicts the interconnect structure having a plurality of fully aligned vias interposed between the lower metal strips and the upper metal strips according to another non-limiting embodiment of the invention; and FIG. 21 depicts the interconnect structure having a plurality of fully aligned vias interposed between the lower metal strips and the upper metal strips according to another non-limiting embodiment of the invention.

Figure 1:
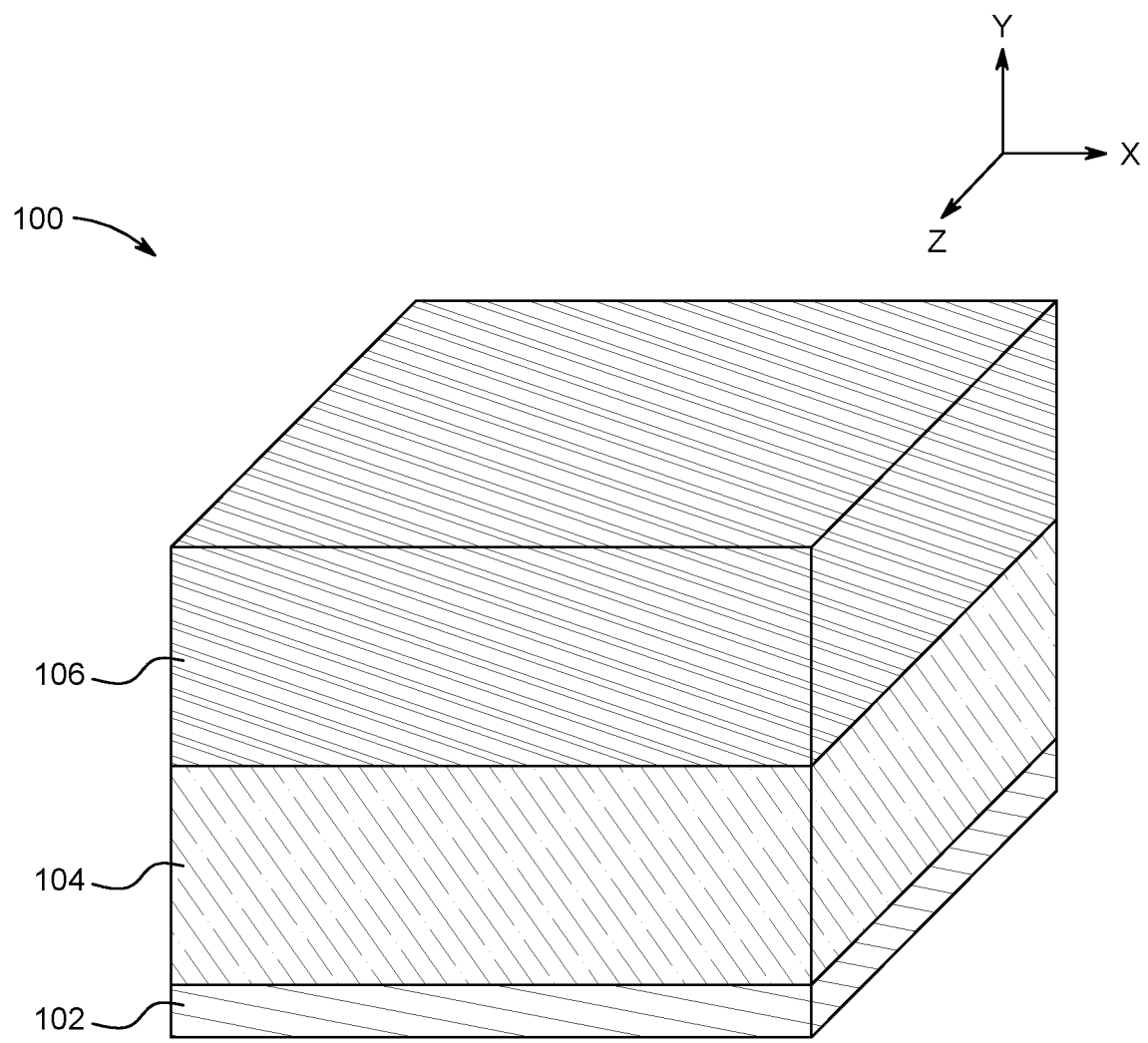

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, interconnect structures resulting from conventional dual damascene fabrication processes are realizing reduced performance characteristics due to continued demands for smaller device profiles in modern complementary metal oxide semiconductor (CMOS) technology. For instance, as the line width scales, the ability to self-align the vias is reduced. For example, one or more sides of the self-aligned via can become misaligned and overlap with respect to the upper and/or lower surfaces of the metal lines thereby causing decreased contact area between the via and metal lines or metal strips. This misalignment causes an increase in the resistivity of between the metal lines and the vias, which ultimately reduces the performance of the interconnect structure. Therefore, a fabrication method capable of providing interconnect structures that satisfy reduced structure profile demands while also achieving reduced line-to-via resistances remains needed.

Turning now to an overview of the aspects of the invention, one or more embodiments of the invention address the above-described shortcomings of the prior art by performing a novel subtractive patterning process that results in fully aligned vias interposed between one or more lower metal strips and one or more upper metal strips. The above-described aspects of the invention address the shortcomings of the prior art by improving via alignment to increase contact area between the vias and metal strips, thereby decreasing overall interconnect resistance. In this manner, interconnect structures can be fabricated that satisfy reduced structure profile demands (e.g., below 7 nm nodes) while also providing reduced line-to-via resistance.

Turning now to a more detailed description of aspects of the present invention, FIGS. 1-9 depict a process flow for forming an interconnect structure according to embodiments of the present invention. FIG. 1 depicts an intermediate interconnect structure 100 according to a non-limiting embodiment of the invention. In the present specification and claims, an "intermediate" interconnect structure is defined as an interconnect structure in a stage of fabrication prior to a final stage. The interconnect structure 100 includes a substrate layer 102, a first (e.g., lower) electrically conductive layer 104 (e.g., a metal layer) and a first hardmask layer 106. The interconnect structure 100 is shown extending along a first axis (e.g., X-axis) to define a length, a second axis (e.g., Y-axis) perpendicular to the X-axis to define a height, and a third axis (e.g., Z-axis) to define a width.

The substrate layer 102 can include a semiconductor material, which can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material includes silicon. The substrate 102 can include a bulk semiconductor substrate or a semiconductor-on-insulator (SOI) substrate. The at least one semiconductor device can be a field effect transistor, a bipolar transistor, a diode, a resistor, a capacitor, an inductor, an electrically programmable fuse, or any combination thereof. Optionally, the substrate 102 can further include at least one dielectric material layer (not shown separately) and metal interconnect structures (not shown separately) embedded therein such as metal lines and/or metal vias.

The metal layer 104 can include various metal materials such as copper (Cu), tungsten (W), aluminum (Al), cobalt (Co), ruthenium (Ru), rhodium (Rh), platinum (Pt), molybdenum (Mo), or any combination thereof. The metal layer 104 can be deposited by various deposition processes, including, by not limited to, chemical vapor deposition (CVD), plasma enhanced chemical vapor deposition (PECVD), sputtering, chemical solution deposition or plating that fills from the bottom upwards (e.g., a bottom-up plating process). The height of the metal layer 104 can be selected based on a desired application of the interconnect structure 100, and assists in determining a height of a lower metal strip (not shown in FIG. 1) as described in greater detail below.

The hardmask layer 106 can include various hardmask materials including, but not limited, SiN, SiO2, SiON, SiCN TiN, TaN, Ti, Ta, or any combination of thereof. A PECVD process, for example, can be performed to deposit the hardmask layer 106.

Figure 2:
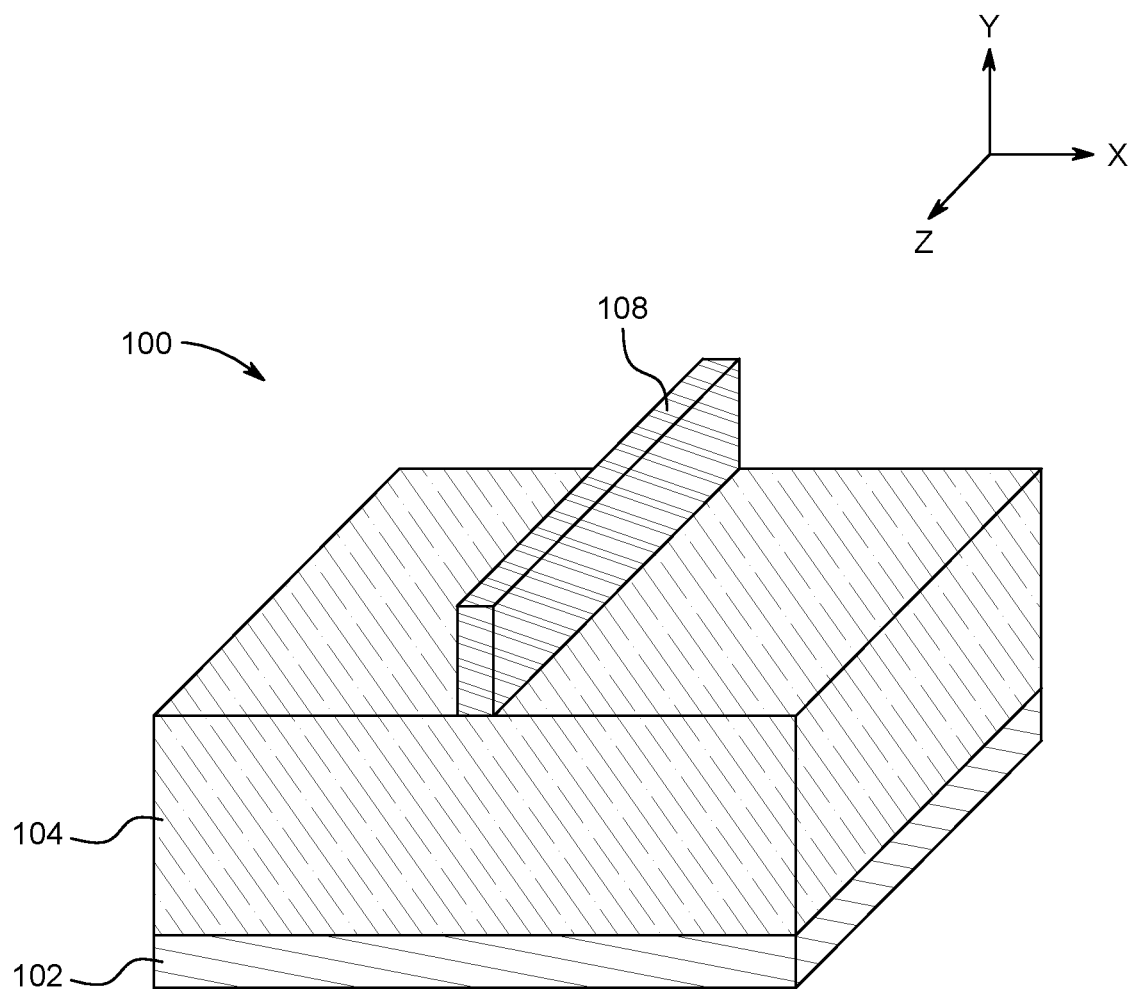

Turning to FIG. 2, the interconnect structure 100 is shown after patterning the first hardmask layer 106. Known lithography and patterning techniques can be used to pattern the hardmask layer 106. Patterning the hardmask layer 106 results in one or more hardmasks elements 108 formed on the upper surface of the metal layer 104. The patterned hardmask element 108 assists in determining the dimensions of a subsequently formed metal strip (not shown in FIG. 2) as described in greater detail below.

Figure 3:
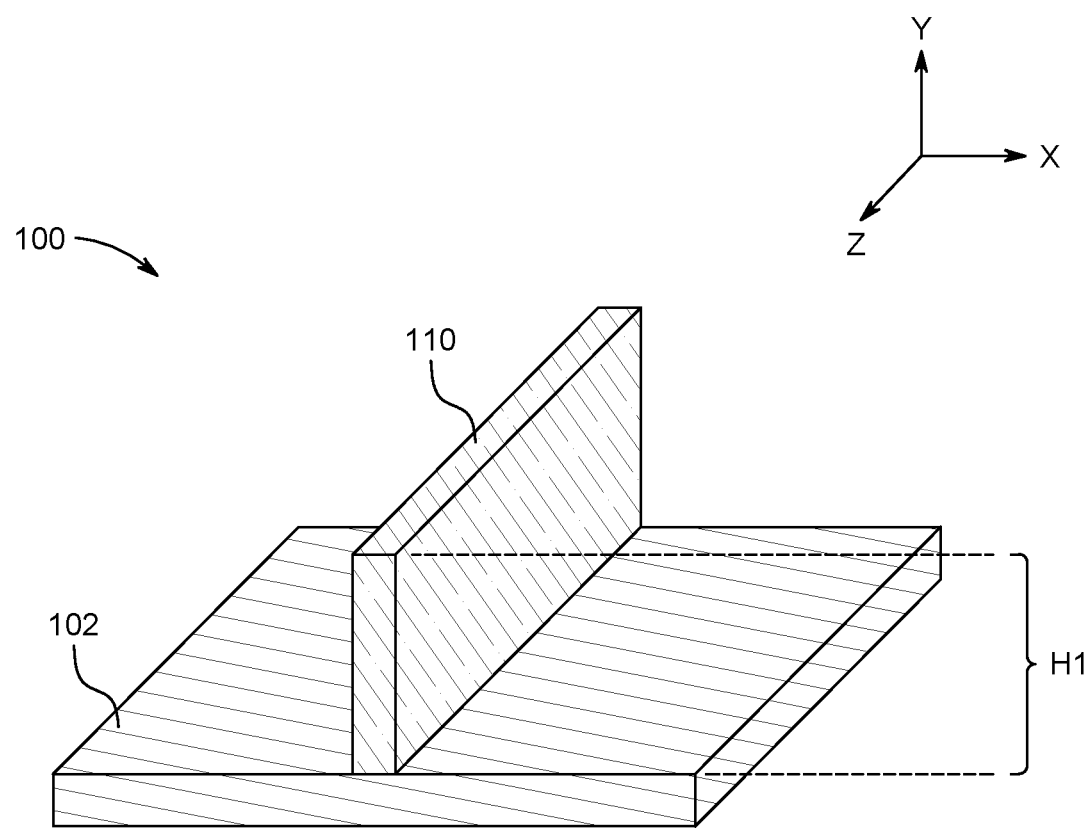

Referring to FIG. 3, the interconnect structure 100 is shown after transferring the hardmask pattern into the metal layer 104. Accordingly, a first-layer metal strip 110, e.g., a lower metal strip 110 (also referred to as a metal line) is formed on an upper surface of the substrate layer 102. A directional reactive ion etch (RIE) process can be performed, for example, to transfer the hardmask pattern into the metal layer to form the metal strip 110. In one or more non-limiting embodiments of the invention, the metal strip 110 extends along the Z-axis at a greater distance compared to the X-axis, and has a total height (H1).

Figure 4:
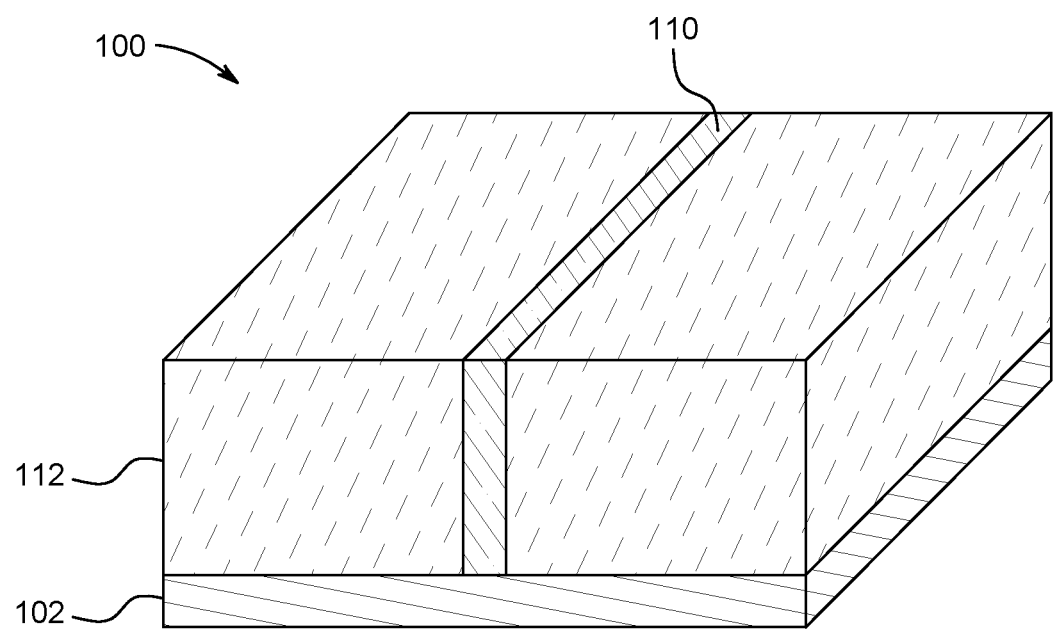

Referring to FIG. 4, the interconnect structure 100 is shown following deposition of an interlayer dielectric (ILD) 112 on an upper surface of the substrate layer 102 to surround the metal strip 110. The ILD 112 can include various low-dielectric materials, and can be deposited using, for example, chemical vapor deposition (CVD) or spin-on deposition techniques. A low-dielectric (low-k) material typically has a dielectric constant (k) that is less than approximately 3.9. In one or more non-limiting embodiments of the invention, the low-k material includes silicon dioxide (SiO2). As further illustrated in FIG. 4, the ILD 112 can be recessed by performing a chemical-mechanical planarization (CMP) process, for example, until the upper surface of the metal strip 110 is exposed.

Figure 5:
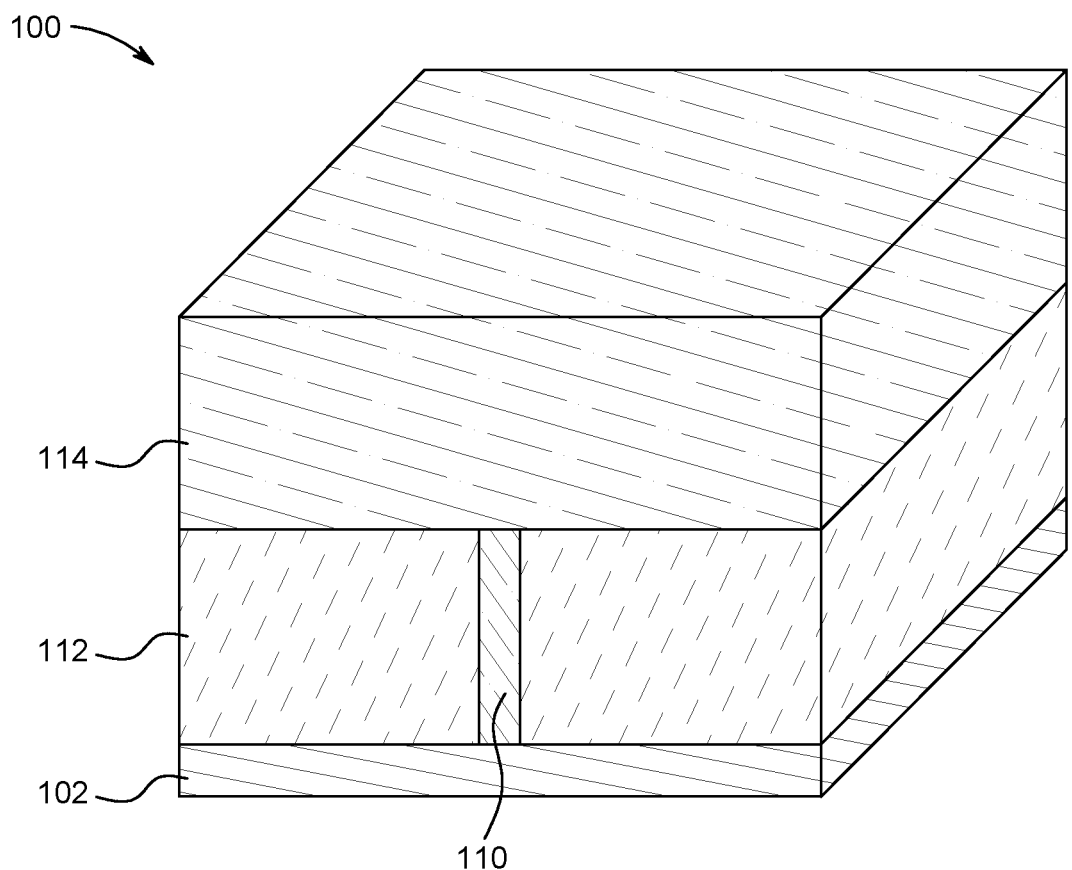

Turning to FIG. 5, the interconnect structure 100 is shown following deposition of a second (e.g., upper) metal layer 114 on the upper surface of the interlayer dielectric 112. The upper metal layer 114 can include various metal materials such as copper (Cu), tungsten (W), aluminum (Al), cobalt (Co), ruthenium (Ru), rhodium (Rh), platinum (Pt), or any combination thereof. The upper metal layer 114 can be deposited by various deposition processes, including, by not limited to, chemical vapor deposition (CVD), plasma enhanced chemical vapor deposition (PECVD), sputtering, chemical solution deposition or plating that fills from the bottom upwards (e.g., a bottom-up plating process). The height of the upper metal layer 114 can be selected based on a desired application of the interconnect structure 100, and assists in determining a height of an upper metal strip (not shown in FIG. 5) as described in greater detail below.

Figure 6:
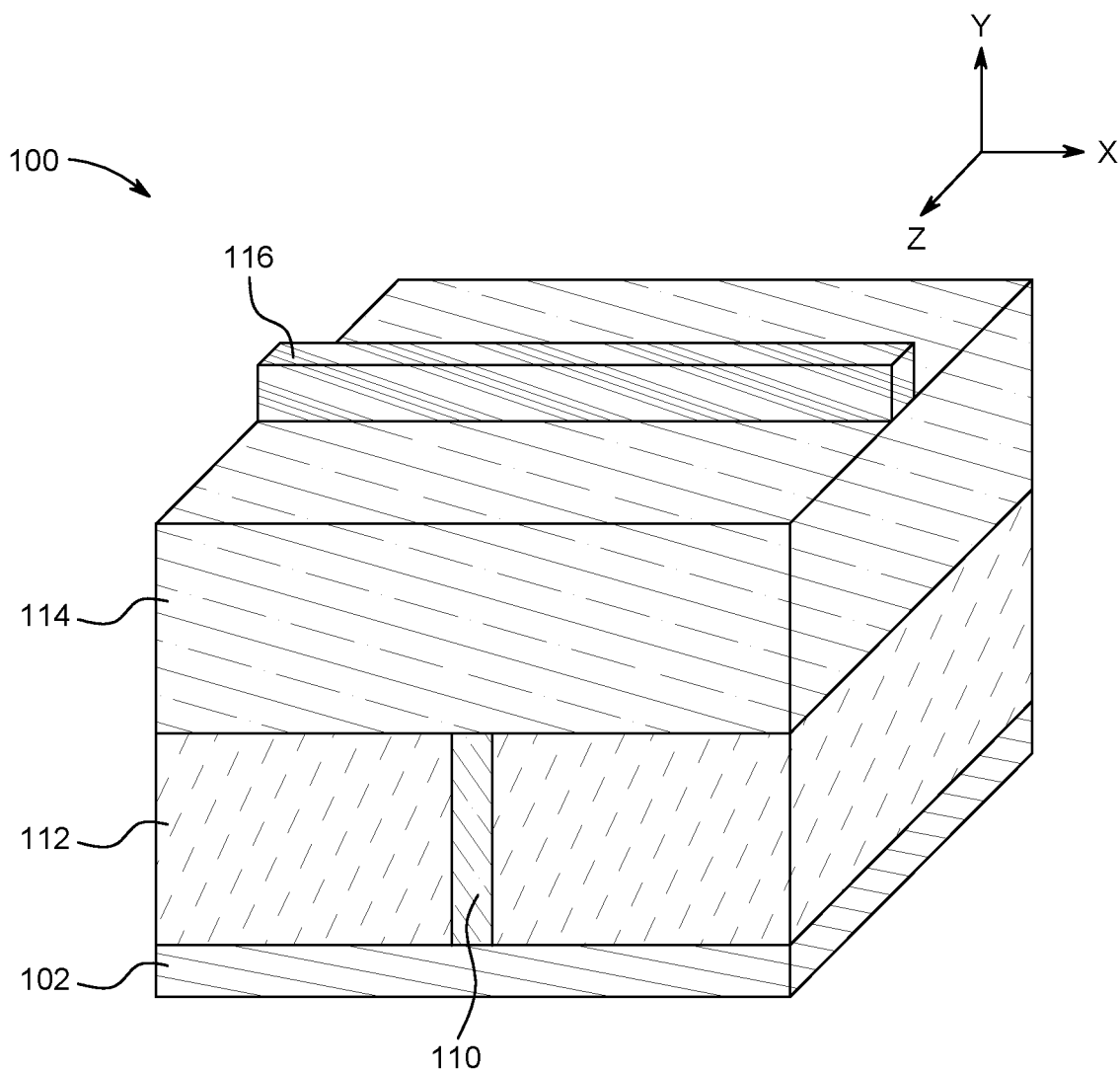

Turning now to FIG. 6, the interconnect structure 100 is shown after patterning a second hardmask layer (not shown in FIG. 6) formed on the upper surface of the upper metal layer 114 to form one or more second hardmask elements 116. Similar lithography and patterning techniques used to form the first hardmask element 108 (see FIG. 2) can also be performed to form the second hardmask element 116. The second hardmask element 116 assists in determining the dimensions of a subsequently formed upper metal strip (not shown in FIG. 6). In one or more embodiments of the invention, the second hardmask element 116 extends in an opposite direction (e.g., perpendicular) with respect to the lower metal strip 110.

Figure 7:
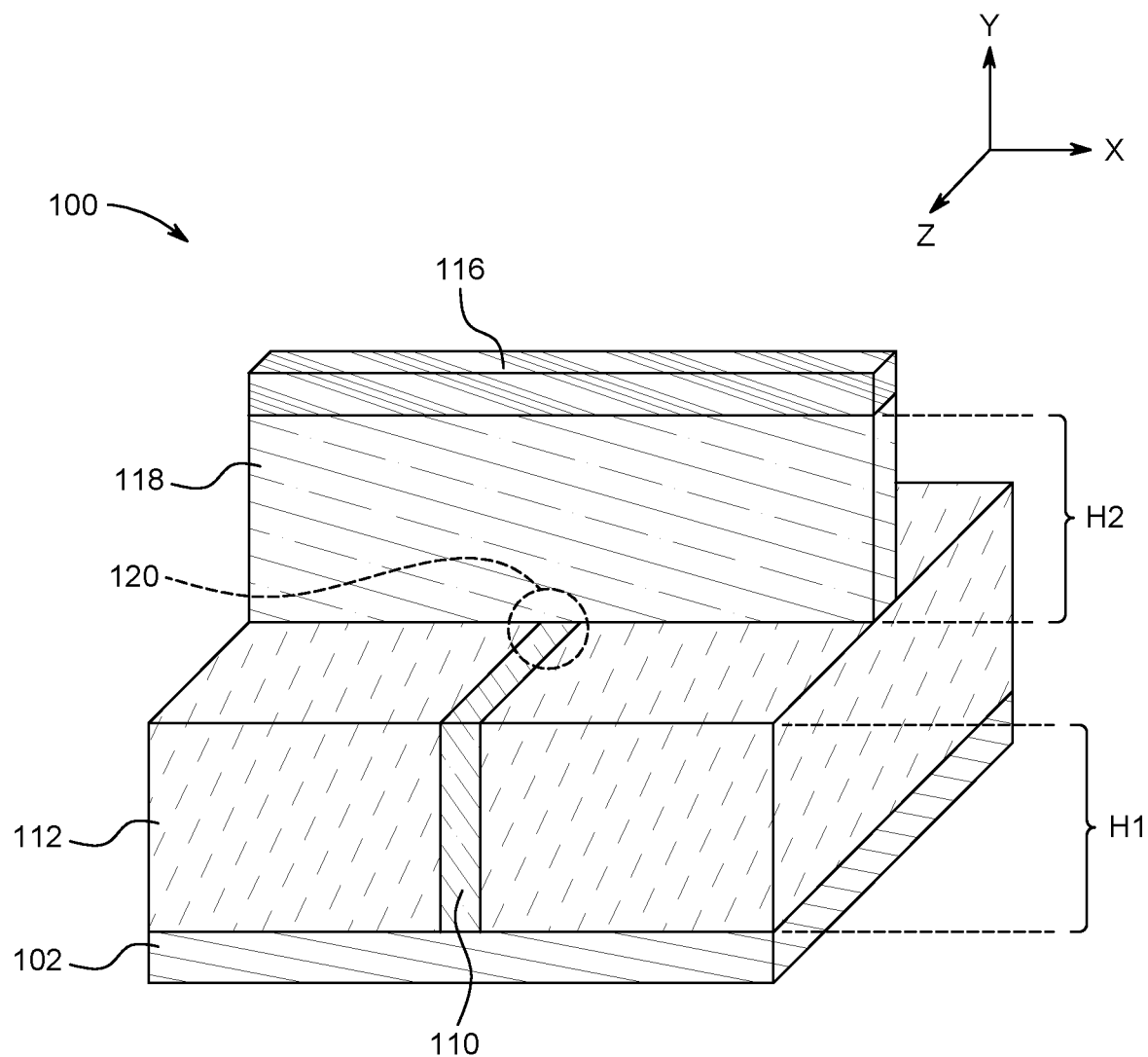

Referring to FIG. 7, the interconnect structure 100 is shown after transferring the hardmask pattern into the upper metal layer 114. Accordingly, a second-layer electrically conductive strip (e.g., metal strip) 118 (e.g., upper metal strip 118) is formed on the upper surface of the ILD 112. A reactive ion etch (RIE) process can be performed, for example, to transfer the hardmask pattern into the metal layer to form the upper metal strip 118. The upper metal strip 118 has a total height (H2). However, the pattern of the second hardmask element 108 results in the upper metal strip 118 extending along the X-axis at a greater distance compared to the Z-axis. Accordingly, the upper metal strip 118 completely extends across the upper surface of the lower metal strip 110, thereby establishing physical contact between the two metal strips 110 and 118 at contact area 120.

Figure 8:
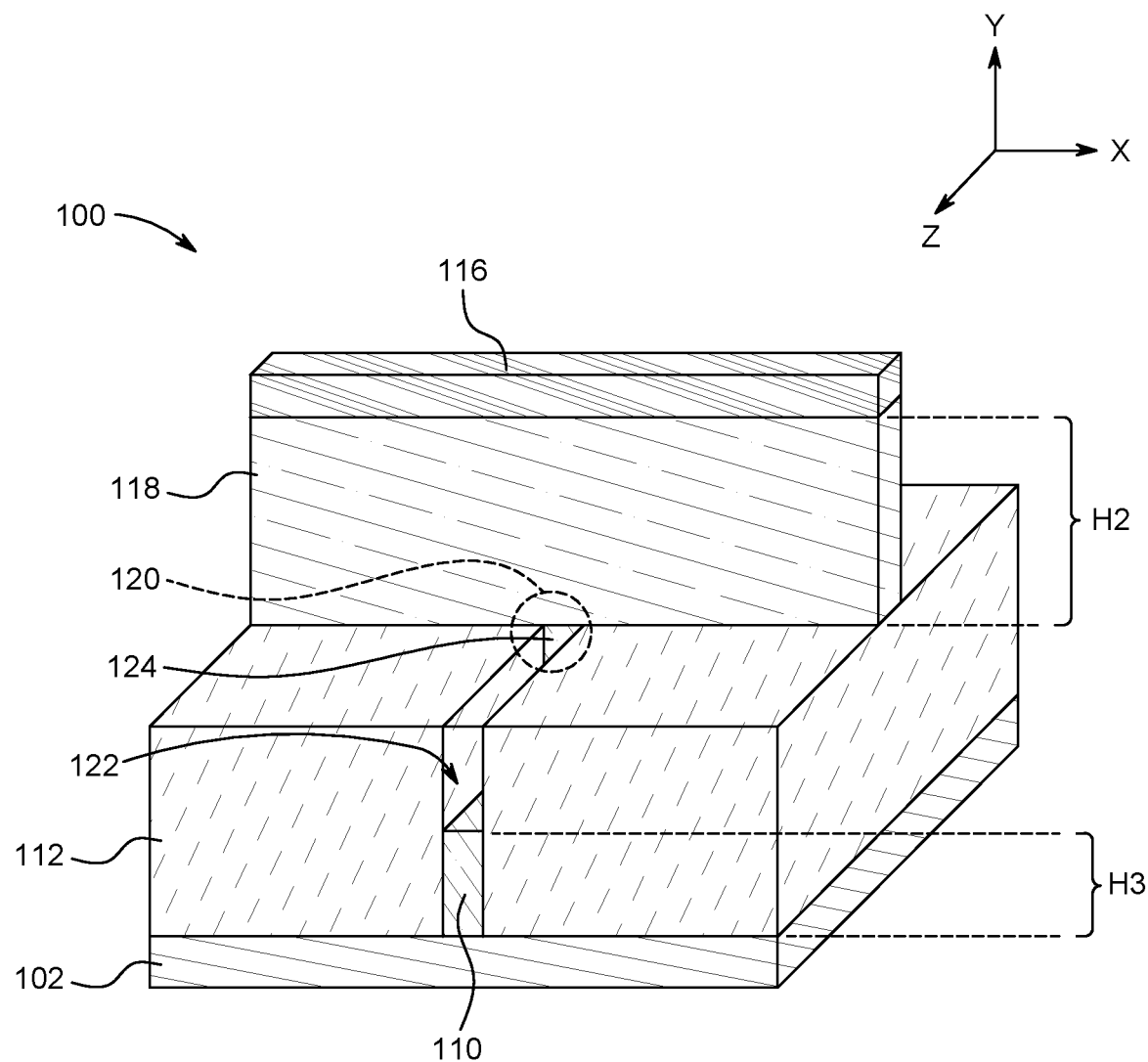

Turning now to FIG. 8, the interconnect structure 100 is shown after recessing exposed portions of the lower metal strip 110 below the ILD 112 to form a cavity 122 at opposing sides of the upper metal strip 118. In one or more non-limiting embodiments of the invention, the cavity can be formed by performing a directional RIE process that is selective to ILD material 112. In this manner, the lower metal strip 110 can be recessed without substantially attacking or etching the ILD 112. The process of subsequently recessing the lower metal strip 110 with respect to the upper metal strip 118 is also referred to herein as a "subtractive patterning process." In one or more embodiments of the invention, the recessed lower metal strip 110 has a decreased height (H3) that is less than the height (H2) of the upper metal strip 118. In addition, because the exposed portions of the lower metal strip 110 is recessed with respect to the upper metal strip 118 and the ILD 112 the length (i.e., extending along the Z-axis) of the resulting cavity 122 matches the length (i.e., extending along the Z-axis) of the recessed portions of the lower metal strip 110.

Figure 9:
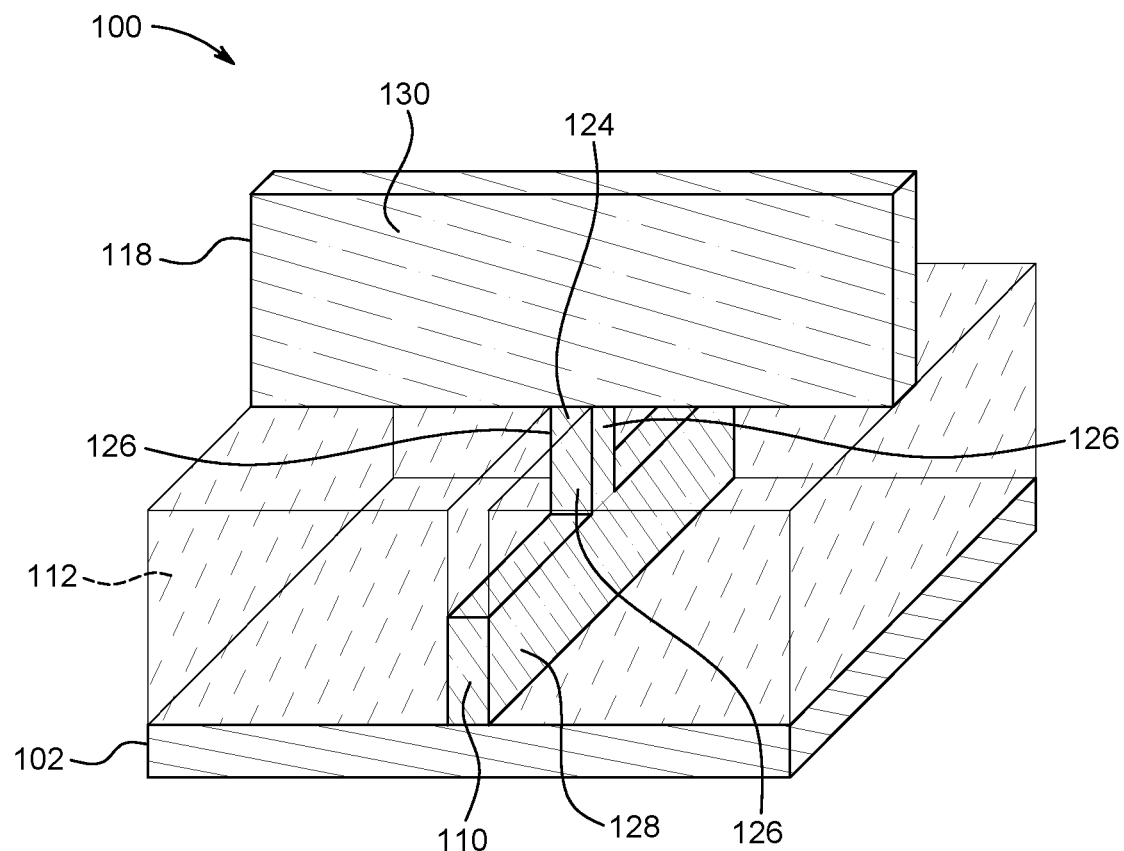

The non-recessed portion of the lower metal strip 110 protected by the overlying upper metal strip 118 defines a fully aligned via (FAV) 124 that is interposed between the remaining portion of the lower metal strip 110 and the upper metal upper strip 118. FIG. 9 depicts the ILD 112 in transparency to show the FAV 124 in greater detail. More specifically, the FAV 124 extends from the lower metal strip 110 and contacts the upper metal strip 118 at the contact area 120. Because the lower metal strip 110 is subsequently recessed with respect to upper metal strip 118, all sides 126 of the FAV 124 are fully aligned with the upper surface of the lower metal strip 110 and the lower surface of the upper metal strip 118 rather than being formed with any overlap. In other words, recessing the lower metal strip 110 with respect to upper metal strip 118 causes all sides 126 of the FAV 124 to be flush (i.e., co-planar) with the sides 128 of the lower metal strip 110 and the sides 130 of the upper metal strips 118. Accordingly, a more precise strip-to-via contact area can be achieved.

Figure 10:
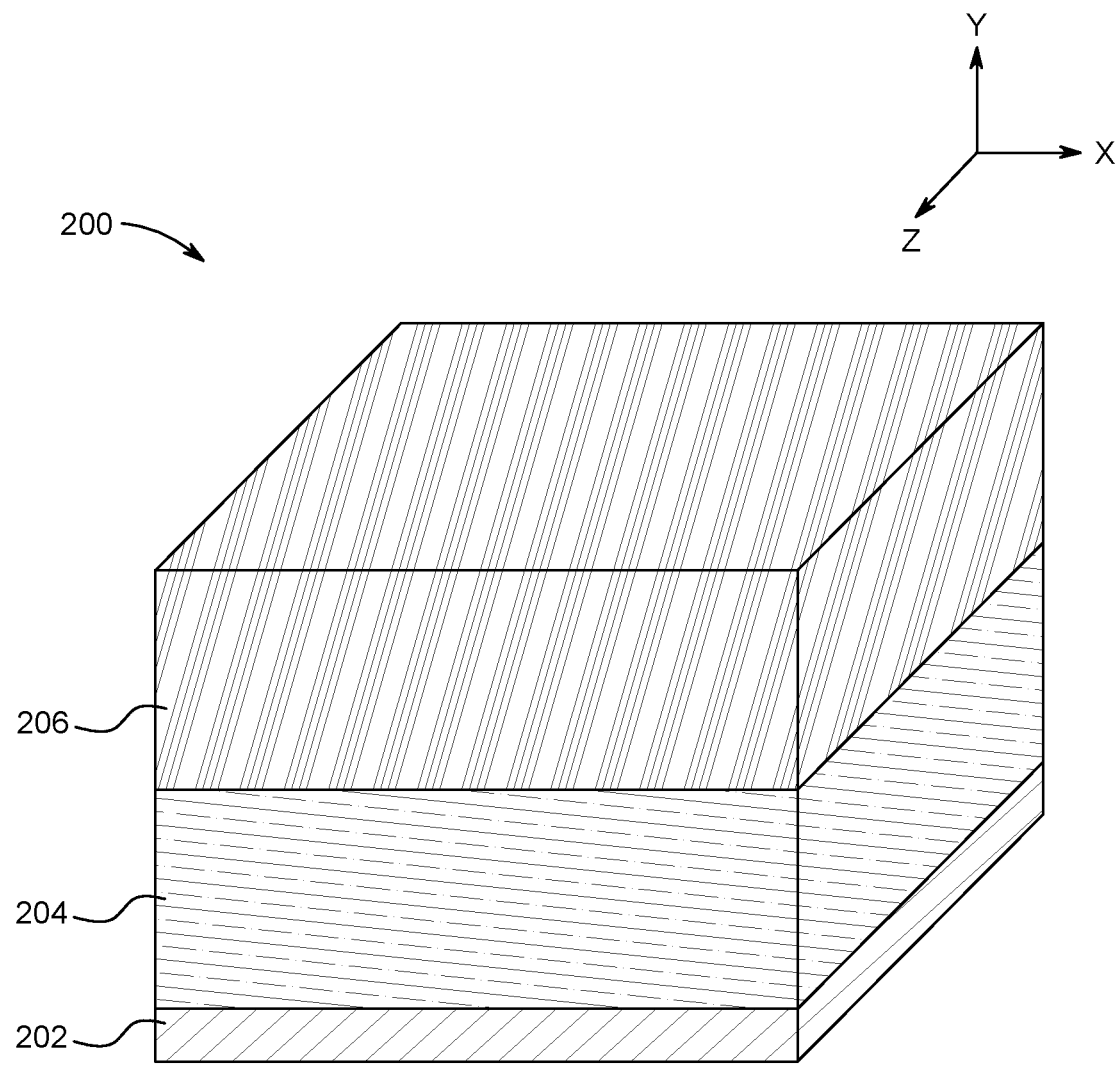

Turning now to FIGS. 10-21, another process flow for forming an interconnect structure is depicted according to embodiments of the present invention. FIG. 10 illustrates an intermediate interconnect structure 200 according to a non-limiting embodiment of the invention. In the present specification and claims, an "intermediate" interconnect structure is defined as an interconnect structure in a stage of fabrication prior to a final stage. The interconnect structure 200 includes a substrate layer 202, a first (e.g., lower) metal layer 204 and a first hardmask layer 206. The interconnect structure 200 is shown extending along a first axis (e.g., X-axis) to define a length, a second axis (e.g., Y-axis) perpendicular to the X-axis to define a height, and a third axis (e.g., Z-axis) to define a width.

The metal layer 204 can include various metal materials such as copper (Cu), tungsten (W), aluminum (Al), cobalt (Co), ruthenium (Ru), rhodium (Rh), platinum (Pt), molybdenum (Mo), or any combination thereof. The metal layer 204 can be deposited by various deposition processes, including, by not limited to, chemical vapor deposition (CVD), plasma enhanced chemical vapor deposition (PECVD), sputtering, chemical solution deposition or plating that fills from the bottom upwards (e.g., a bottom-up plating process). The height of the metal layer 204 can be selected based on a desired application of the interconnect structure 200, and assists in determining a height of a lower metal strip as described in greater detail below.

The hardmask layer 206 can include various hardmask materials including, but not limited, SiN, SiO2, SiON, SiCN TiN, TaN, Ti, Ta, or any combination of thereof. A PECVD process, for example, can be performed to deposit the hardmask layer 106.

Figure 11:
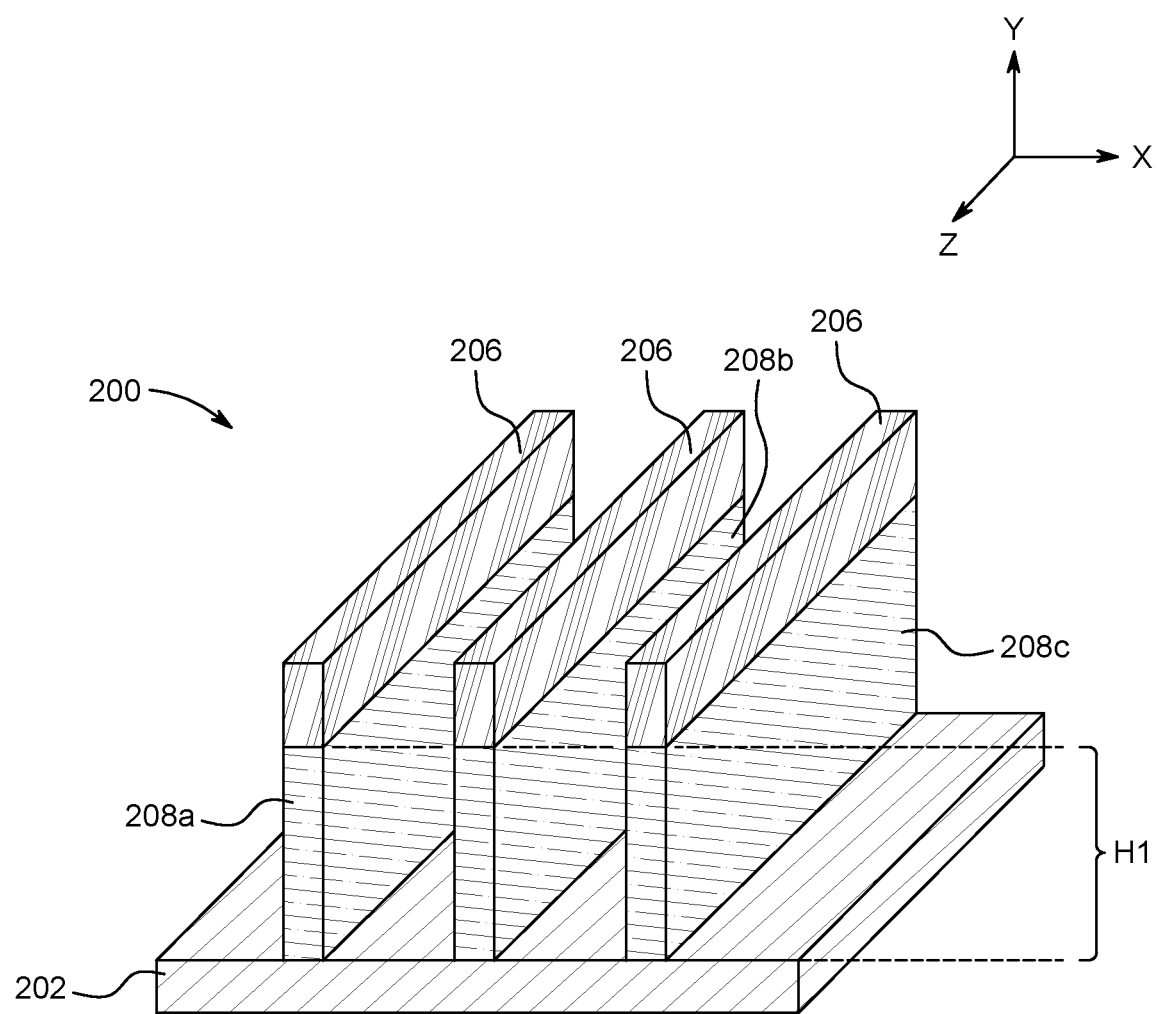

Turning to FIG. 11, the interconnect structure 200 is shown after patterning the first hardmask layer 206 and transferring the pattern into the metal layer 204 to form a plurality of first-layer electrically conductive strips (e.g., metal strips) 208a, 208b, 208c (e.g., lower metal strips). Known lithography and patterning techniques can be used to pattern the hardmask layer 206, and a directional RIE process can be performed to transfer the pattern into the metal layer 204. In one or more non-limiting embodiments of the invention, the lower metal strips 208a, 208b, 208c extend along the Z-axis at a greater distance compared to the X-axis, and have an initial total height (H1).

Figure 12:
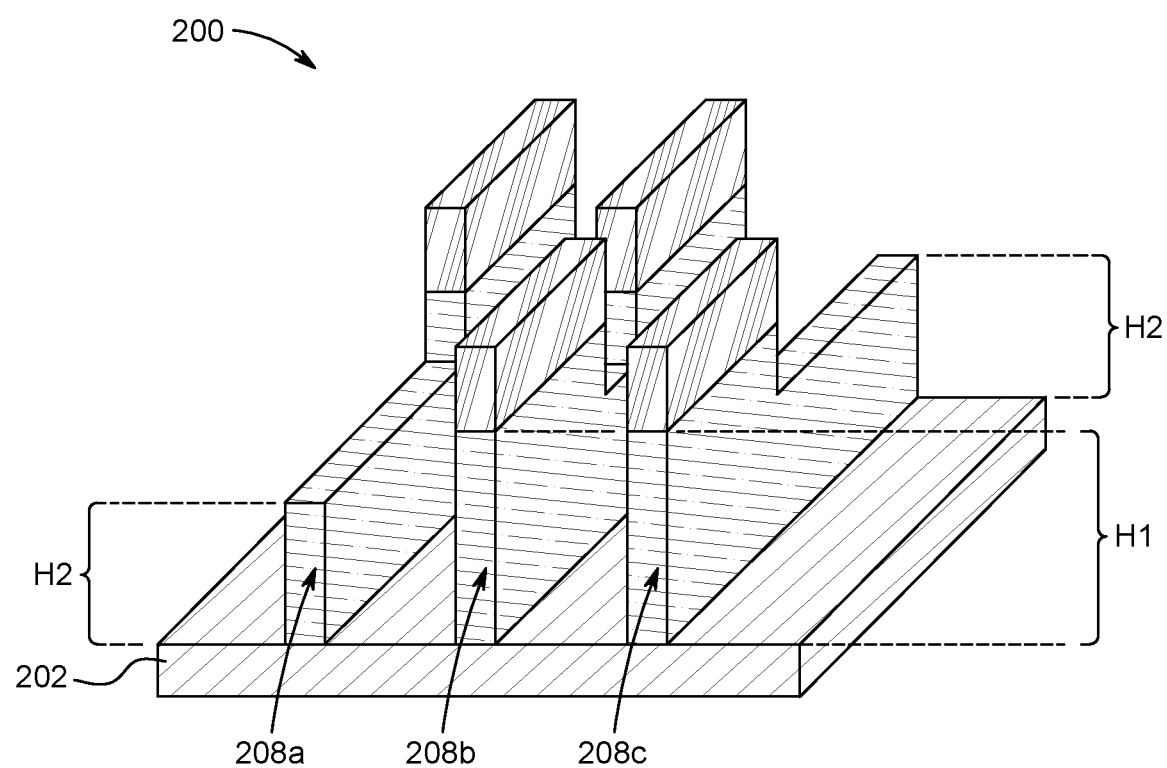

Referring to FIG. 12, the hardmask layers 206 are patterned, and each pattern is transferred into a respective metal strip 208a, 208b, 208c. Various known lithography and patterning techniques can be used to pattern the hardmask layers 206. Accordingly, uncovered portions of metal strips 208a, 208b, 208c are recessed, while portions of the metal strips 208a, 208b, 208c covered by the remaining hardmask layers 206 are preserved.

Figure 13:
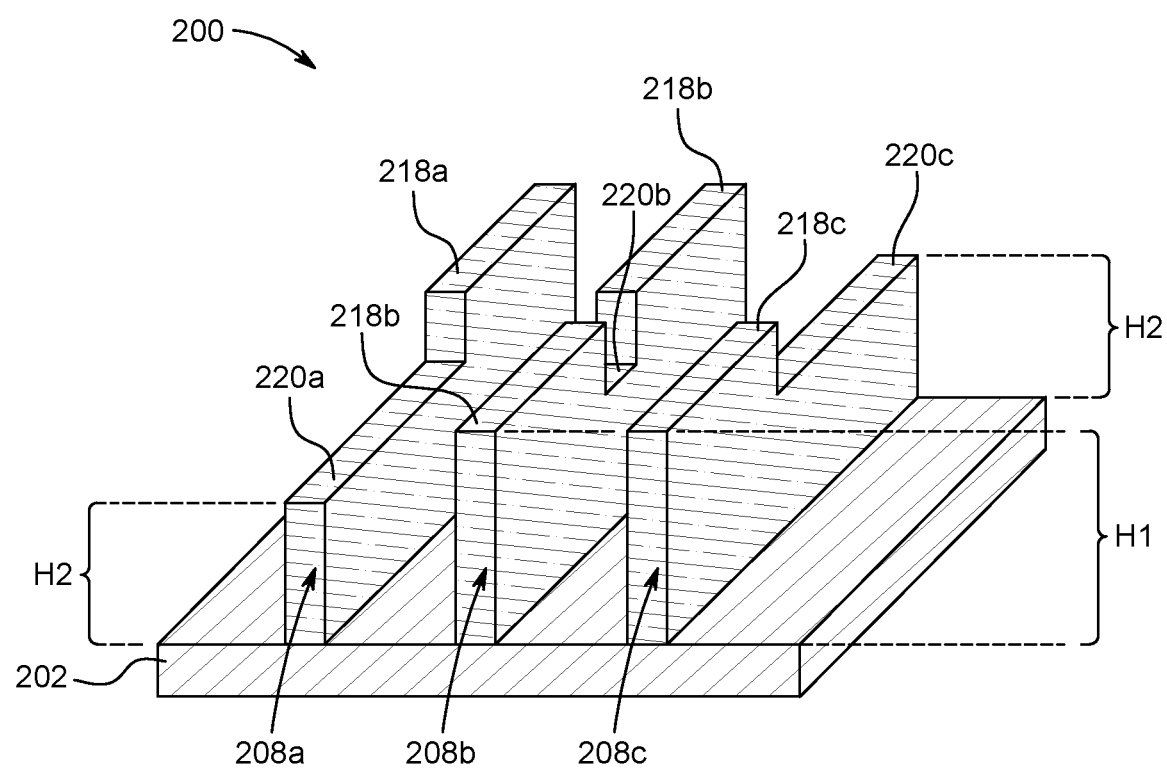

Referring to FIG. 13, the interconnect structure 200 is shown after removing the remaining hardmask layers 206. As shown, the preserved portions 218a, 218b, 218c (i.e., non-recessed portions) of the lower metal strips 208a, 208b, 208c previously covered by the hardmask layers 206 are preserved according to their initial height (H1), while the remaining portions 220a, 220b, 220c (i.e., recessed portions) of the lower metal strips 208a, 208b, 208c are recessed below the non-recessed portions 218a, 218b, 218c, thereby defining a second height (H2) that is less than the initial height (H1). Accordingly, the non-recessed portions 218a, 218b, 218c can be utilized as a contact area for connecting fully aligned vias (not shown in FIG. 13) to upper metal strips (not shown in FIG. 13) that are formed at a later stage of the process flow described in greater detail below.

Figure 14:
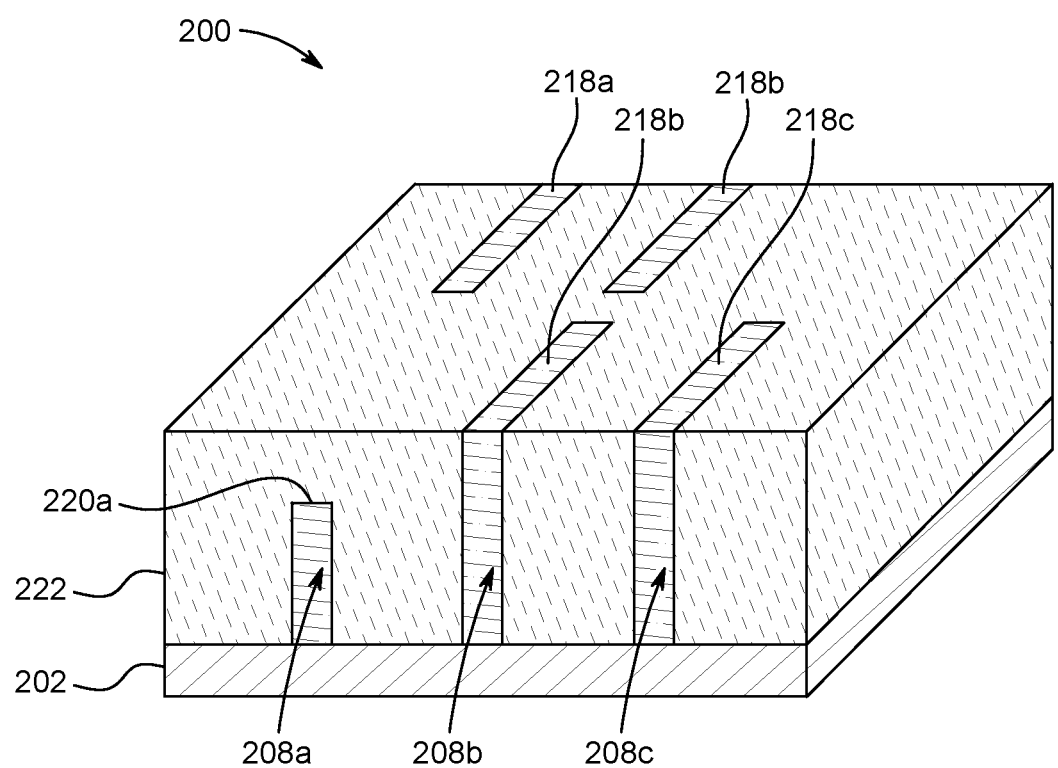

Turning now to FIG. 14, the interconnect structure 200 is shown following deposition of an ILD 222 that surrounds the lower metal strips 208a, 208b, 208c. The ILD 222 can include various low-dielectric materials, and can be deposited using, for example, chemical vapor deposition (CVD) or spin-on deposition techniques. The low-dielectric (low-k) material describe herein typically has a dielectric constant (k) that is less than approximately 3.9. In one or more non-limiting embodiments of the invention, the low-k material includes silicon dioxide (SiO2). As further illustrated in FIG. 14 the ILD 222 can be recessed by performing a chemical-mechanical planarization (CMP) process, for example, until the upper surface of the non-recessed metal strip portions 218a, 218b, 218c are exposed.

Figure 15:
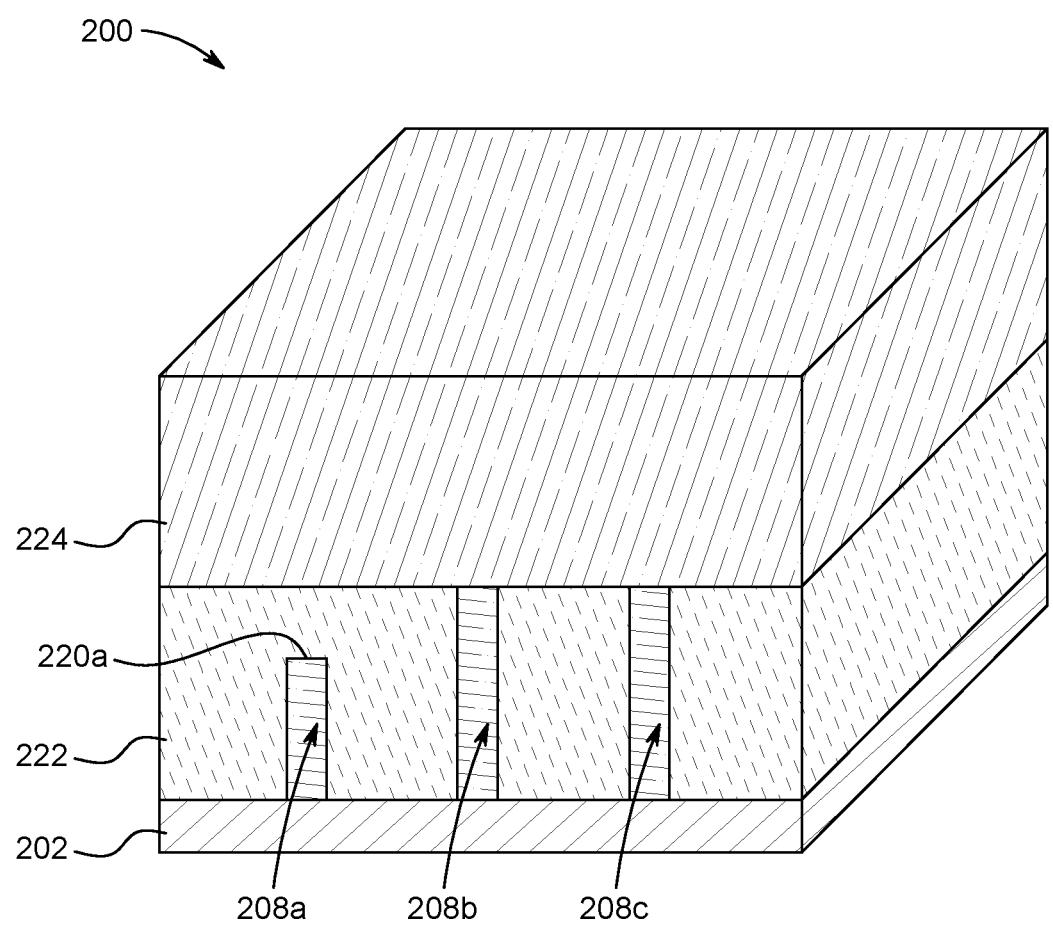

Referring to FIG. 15, the interconnect structure 200 is shown following deposition of a second metal layer 224 (e.g., upper metal layer) on the upper surface of the ILD 222. The upper metal layer 224 can include various metal materials such as copper (Cu), tungsten (W), aluminum (Al), cobalt (Co), ruthenium (Ru), rhodium (Rh), platinum (Pt), molybdenum (Mo), or any combination thereof. The upper metal layer 224 can be deposited by various deposition processes, including, by not limited to, chemical vapor deposition (CVD), plasma enhanced chemical vapor deposition (PECVD), sputtering, chemical solution deposition or plating that fills from the bottom upwards (e.g., a bottom-up plating process). The height of the upper metal layer 224 can be selected based on a desired application of the interconnect structure 200, and assists in determining a height of upper metal strips (not shown in FIG. 15) to be formed at a later stage of the process flow as described in greater detail below.

Figure 16:
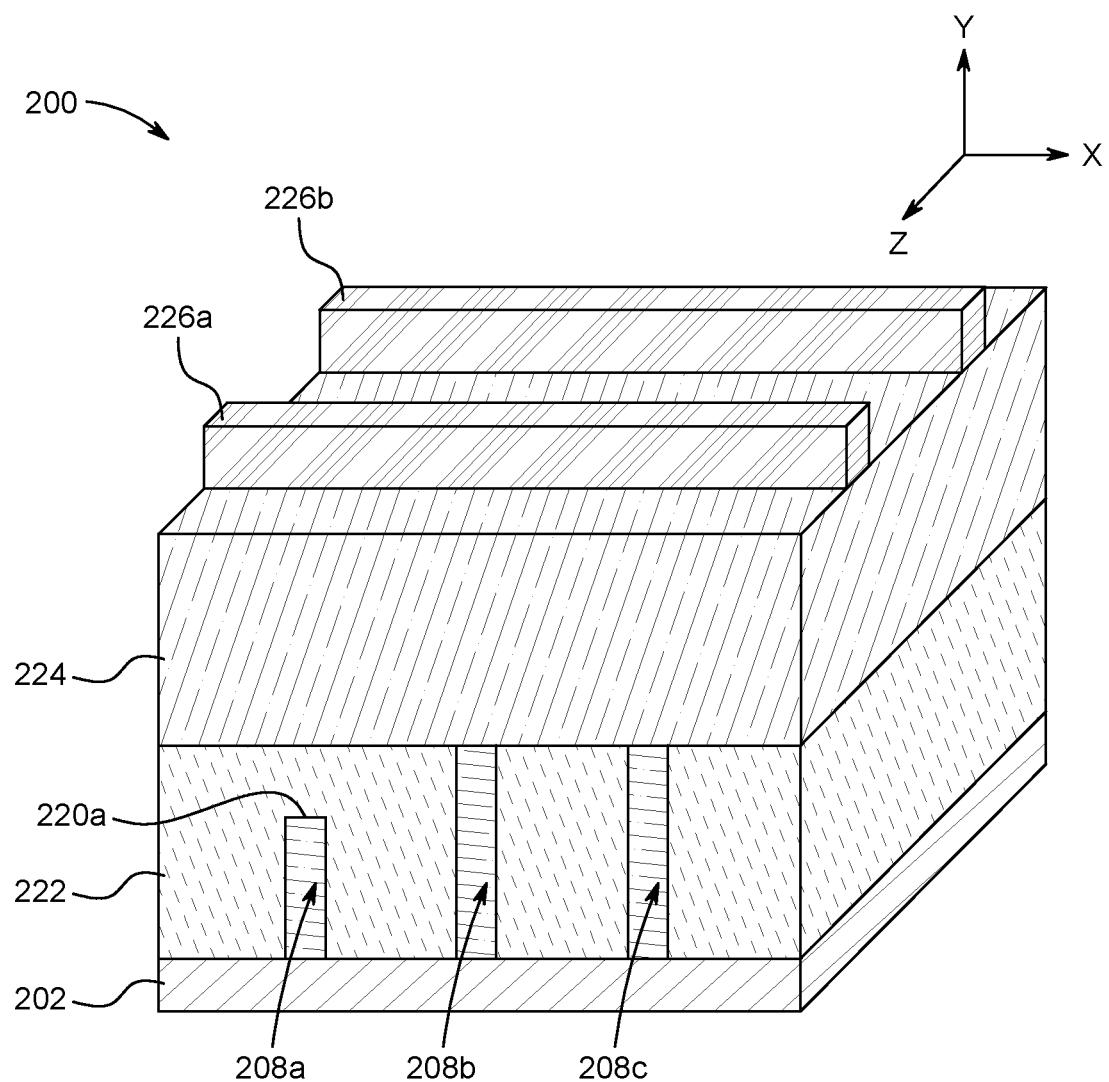

Turning now to FIG. 16, the interconnect structure 200 is shown after patterning a third hardmask layer (not shown in FIG. 16) formed on the upper surface of the upper metal layer 224 to form a plurality of hardmask elements 226a, 226b. Similar lithography and patterning techniques used to pattern the first hardmask layer 206 (see FIG. 11) can also be performed to pattern the third hardmask layer and form the hardmask elements 226a, 226b. The hardmask elements 226a, 226b assist in determining the dimensions of the upper metal strips (not shown in FIG. 16) to be formed at a later stage of the process flow. In one or more non-limiting embodiments of the invention, the hardmask elements 226a, 226b extend in an opposite direction (e.g., perpendicular) with respect to the lower metal strip 208a, 208b, 208c.

Figure 17:
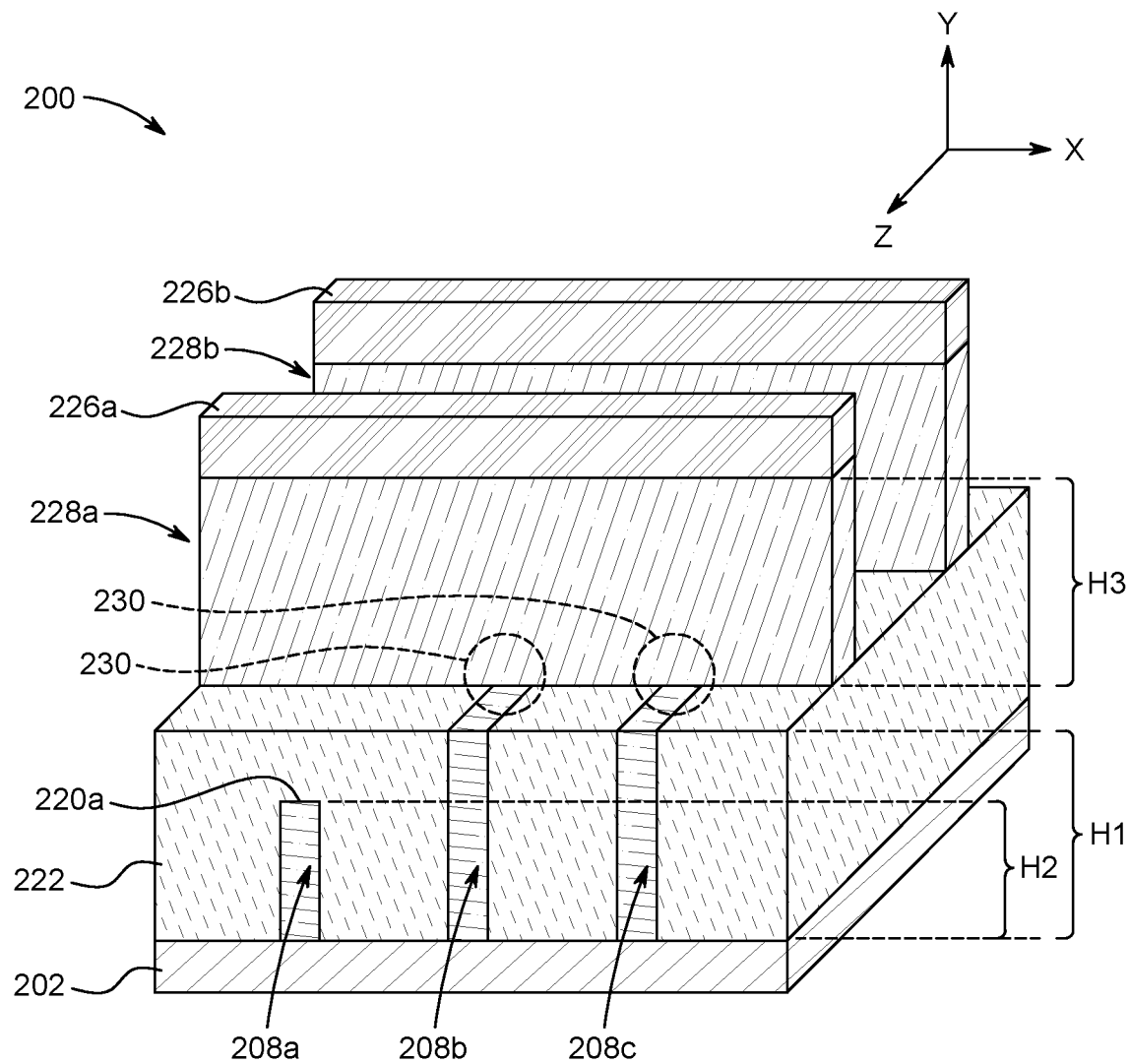

Referring to FIG. 17, the interconnect structure 200 is shown after transferring the hardmask pattern into the upper metal layer 224 (see FIG. 16). Accordingly, a plurality of second-layer metal strips 228a, 228b (e.g., upper metal strips) are formed on the upper surface of the ILD 222. A reactive ion etch (RIE) process can be performed, for example, to transfer the hardmask pattern into the metal layer to form the upper metal strips 228a, 228b. Similar to the lower metal strips 208a, 208b, 208c, the upper metal strips 228a, 228b have a total height (H3). However, the pattern of the hardmask elements 226a, 226b results in the upper metal strips 228a, 228b extending along the X-axis at a greater distance compared to the Z-axis. Accordingly, the upper metal strips 228a, 228b completely extend across the upper surface of the lower metal strips 208a, 208b, 208c, thereby establishing physical contact between the upper metal strips 228a, 228b and contact areas 230 of one or more respective lower metal strips 208a, 208b, 208c.

Figure 18:
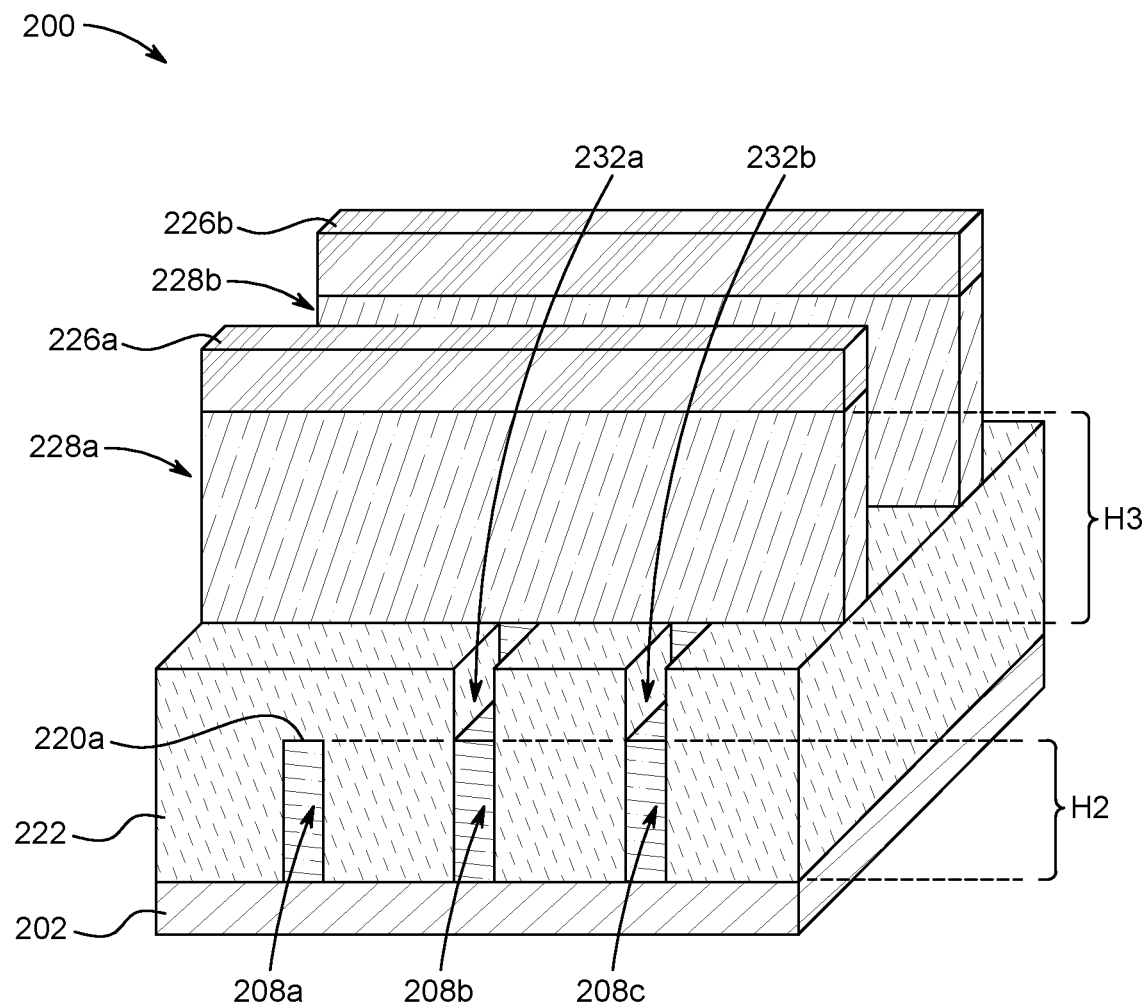

Turning now to FIG. 18, the interconnect structure 200 is shown after recessing exposed portions of the lower metal strips 208b, 208c below the ILD 222 to form respective cavities 232a, 232b at opposing sides of the upper metal strips 228a, 228b. In one or more non-limiting embodiments of the invention, the cavities 232a, 232b can be formed by performing a directional RIE process that is selective to the ILD 222. In this manner, the exposed lower metal strips 208b, 208c can be recessed without substantially attacking or etching the ILD 222. As described above, the process of subsequently recessing metal lines and/or vias is referred to herein as a "subtractive patterning process," and is different from a conventional damascene process which etches the dielectric when forming the metal lines and/or vias. The resulting recessed lower metal strips 208b, 208c are formed having a second height (H2). In one or more non-limiting embodiments of the invention, the exposed portions 218a, 218b, 218c can be recessed to have a height (H2) that matches the recessed height (H2) of the portions of the lower metal strips 208a, 208b, 208c covered by the ILD 222. In addition, although the recessed lower metal strips 208b, 208c are shown having the same height (H2) as the non-recessed metal strip 208a, the invention is not limited thereto. In other embodiments of the invention, the lower metal strips 208a, 208b and 208c can have different heights as described in greater detail below.

Figure 19:
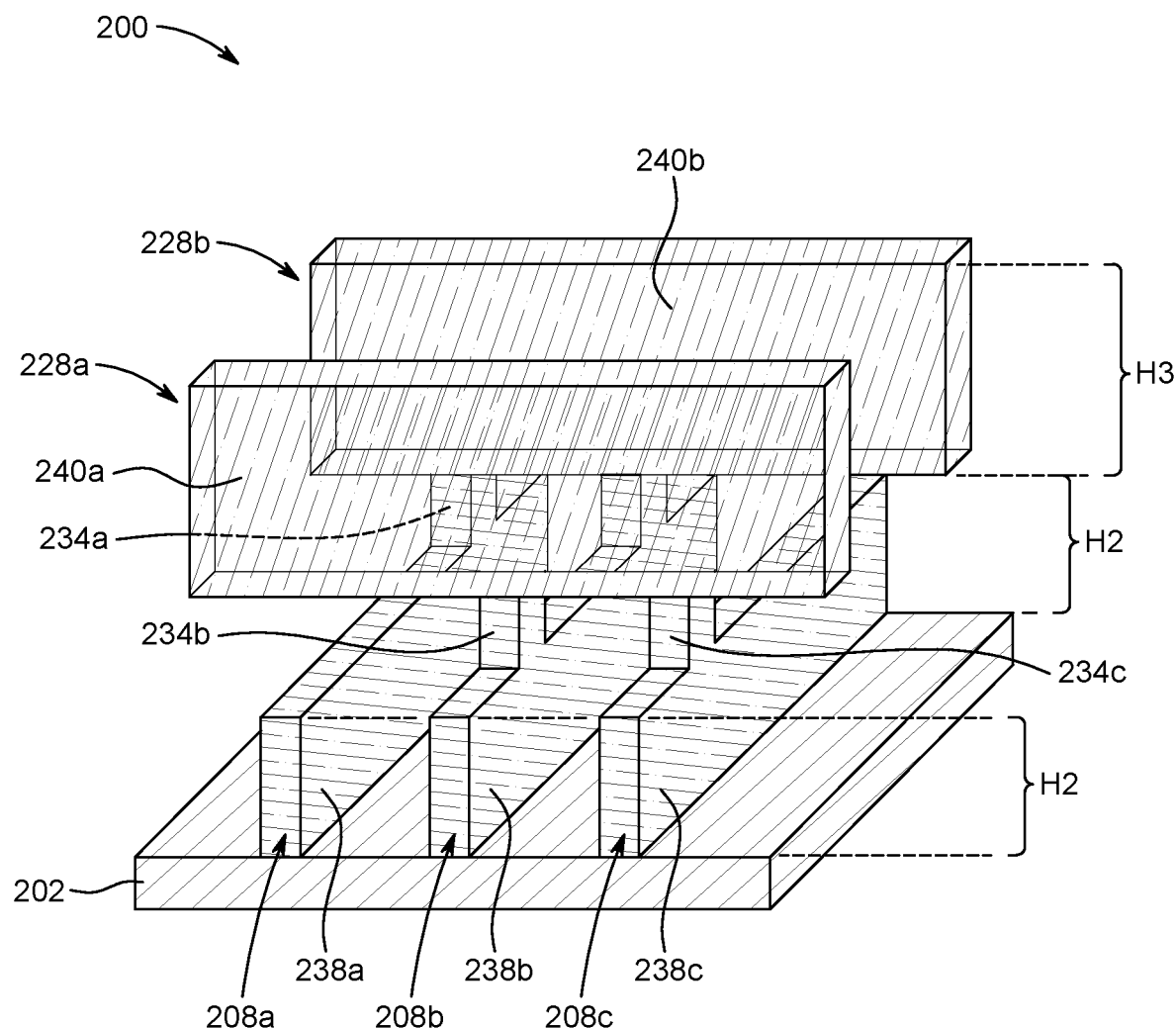

Referring to FIG. 19, the non-recessed portions of the lower metal strip strips 208b, 208c covered by the overlying upper metal strips 228a, 228b define fully aligned vias (FAVs) 234a, 234b, 234c that are interposed between the remaining portion of the lower metal strips 208a, 208b, 208c and the upper metal strips 228a, 228b. FIG. 19 depicts the ILD 222 in transparency to show the FAVs 234a, 234b, 234c in greater detail. More specifically, the FAVs 234a, 234b, 234c extend from a respective lower metal strip 208a, 208b, 208c and contact an upper metal strip 228a, 228b at a respective contact area 130. Because the lower metal strips 208a, 208b, 208c are subsequently recessed with respect to the upper metal strips 228a, 228b, all sides 236 of the FAVs 234a, 234b, 234c are fully aligned with the upper surface of the lower metal strips 208a, 208b, 208c and the lower surface of the upper metal strips 228a, 228b rather than being formed with any overlap. In other words, recessing the lower metal strips 208a, 208b, 208c with respect to the upper metal strips 228a, 228b causes all sides 126 of the FAVs 234a, 234b, 234c to be flush (i.e., co-planar) with the sides 238 of the lower metal strips 208a, 208b, 208c and the sides 240 of the upper metal strips 228a, 228b. Accordingly, a more precise strip-to-via contact area can be achieved.

In one more non-limiting embodiments of the invention, the depths of the cavities 232a, 232b can vary. The variation in the cavity depths allows for forming different heights between one or more of the metal strips (e.g., lower metal strips 208a, 208b, 208c.). Turning FIG. 20, for example, the cavities 232a, 232b have a depth that are deeper compared to the depth of the cavities shown in FIG. 18. Because portions 218a, 218b and 218c of the lower metal strips 208a, 208b, 208c are exposed while the remaining portions are covered by the ILD 222 (see FIG. 14), first recessed portions 242 of the lower metal strips 208a, 208b, 208c maintain their initial recessed height (H2), while second recessed portions 244 of the lower metal strips 208a, 208b, 208c have a decreased height (H4) with respect to the initial recessed height (H2). As a result, a step portion 246 is formed at the boundary between the first recessed portions 242 and the second recessed portions 244.

Figure 20:
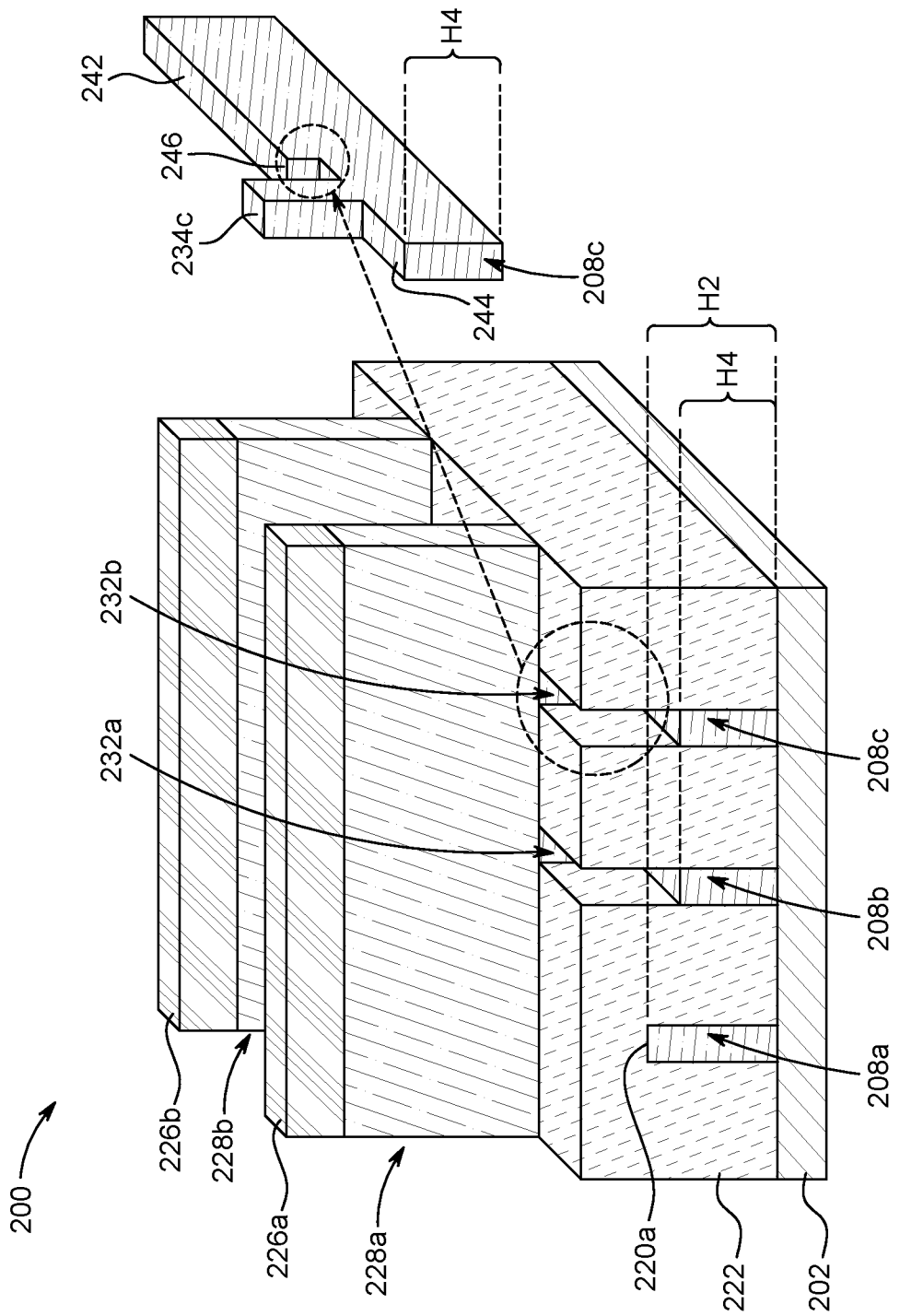
Figure 21:
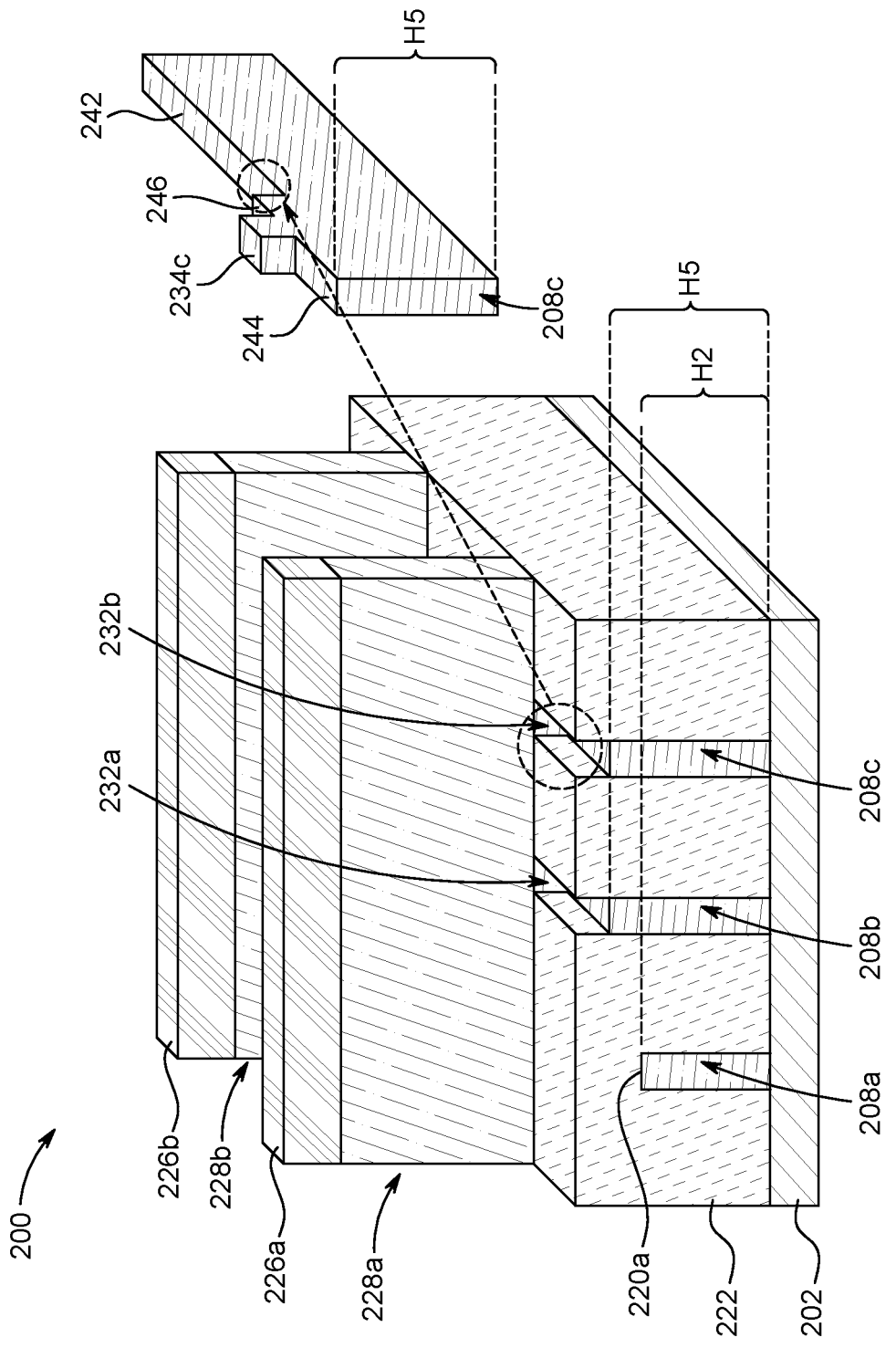

FIG. 21 shows another non-limiting embodiment of the invention of which the cavities 232a, 232b have a depth that are shallower compared to the depth of the cavities shown in FIG. 20. The first recessed portions 242 of the lower metal strips 208a, 208b, 208c maintain their initial recessed height (H2) because they are covered by the ILD 222. The second recessed portions 244, however, have a greater height (H5) with respect to the initial recessed height (H2) of the first recessed portions 242. The differences in height still form a step portion 246 at the boundary between the first recessed portions 242 and the second recessed portions 244.

As described herein, various non-limiting embodiments of the invention provide a novel subtractive patterning process that results in fully aligned vias interposed between one or more lower metal strips and one or more upper metal strips. The resulting interconnect structure has increased contact area between the fully aligned vias and the metal strips, thereby decreasing overall interconnect resistance. In this manner, the interconnect structures fabricated according to the teachings described herein can satisfy reduced structure profile demands (e.g., below 7 nm nodes) while also providing reduced line-to-via resistance.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating an interconnect structure, the method comprising:
    forming a first electrically conductive strip that extends along a first direction on an upper surface of a substrate;
    recessing a first portion of the first electrically conductive strip;
    after recessing the first portion of the first electrically conductive strip, depositing an interlayer dielectric (ILD) material on the substrate to cover the first electrically conductive strip, and etching the ILD material to expose an upper surface of the first electrically conductive strip;
    forming a second electrically conductive strip on an upper surface of the ILD material so that the second electrically conductive strip extends along a second direction opposite the first direction and across the first electrically conductive strip; and
    recessing exposed portions of the first electrically conductive strip located on opposing sides of the second electrically conductive strip while preserving a covered portion of the first electrically conductive strip covered by the second electrically conductive strip to form a fully aligned via (FAV) between the first electrically conductive strip and the second electrically conductive strip.

2. The method of claim 1, wherein the FAV includes a first end that directly contacts an upper surface of the first electrically conductive strip and an opposing second end that directly contacts a lower portion of the second electrically conductive strip.

3. The method of claim 1, wherein all sides of the FAV are co-planar with opposing sides of the first electrically conductive strip and the opposing sides of the second electrically conductive strip such that the FAV is fully aligned with the first electrically conductive strip and the second electrically conductive strip.

4. The method of claim 1, wherein the first and second electrically conductive strips include a metal material selected from a group comprising of copper, tungsten, cobalt, rhodium, platinum, molybdenum, and combinations thereof.

5. The method of claim 1, wherein after recessing the first electrically conductive strip, the second electrically conductive strip has a first height extending from the second end of the FAV to an upper surface of the second electrically conductive strip and the first electrically conductive strip has a second height extending from the substrate to the first end of the FAV, the second height being less than the first height.

6. An interconnect structure comprising:
    an interlayer dielectric (ILD) on a substrate, the ILD having a cavity extending through the ILD along a first direction;
    a first electrically conductive strip that is formed on the substrate and within the cavity, the first electrically conductive strip extends along the first direction and across an upper surface of the substrate, the first electrically conductive strip including a first recessed portion having a first etched upper surface, and a second recessed portion different from the first etched portion having a second etched upper surface that is covered by the ILD;
    a second electrically conductive strip on an upper surface of the ILD, the second electrically conductive strip extending along a second direction opposite the first direction; and
    a fully aligned via (FAV) extending between the first electrically conductive strip and the second electrically conductive strip,
    wherein all sides of the FAV are co-planar with opposing sides of the first electrically conductive strip and opposing sides of the second electrically conductive strip such that the FAV is fully aligned with the first electrically conductive strip and the second electrically conductive strip.

7. The interconnect structure of claim 6, wherein the FAV includes a first end that directly contacts an upper surface of the first electrically conductive strip and an opposing second end that directly contacts a lower portion of the second electrically conductive strip.

8. The interconnect structure of claim 6, wherein a first length of the cavity extending from the ILD to a side of the FAV matches a second length of the first electrically conductive strip extending from the ILD to the side of the FAV.

9. The interconnect structure of claim 6, wherein the first and second electrically conductive strips include a metal material selected from a group comprising of copper, tungsten, cobalt, rhodium, platinum, molybdenum, and combinations thereof.

10. The interconnect structure of claim 6, wherein the second electrically conductive strip has a first height extending from the second end of the FAV to an upper surface of the second electrically conductive strip and the first electrically conductive strip has a second height extending from the substrate to the first end of the FAV, the second height being less than the first height.

11. A method of forming an interconnect structure, the method comprising:
forming a plurality of first-layer electrically conductive strips that extend along a first direction on an upper surface of a substrate;
recessing a first portion of at least one of the first electrically conductive strips;
after recessing the first portion, depositing an interlayer dielectric material on the substrate to cover the first-layer electrically conductive strips, and etching the ILD to expose an upper surface of the first-layer electrically conductive strips;
forming a plurality of second-layer electrically conductive strips on an upper surface of the ILD so that the second-layer electrically conductive strips extend along a second direction opposite the first direction and across the first-layer electrically conductive strips; and
recessing exposed portions of the first-layer electrically conductive strips located on opposing sides of each of the second-layer electrically conductive strips while preserving a covered portion of the first-layer electrically conductive strips covered by the second-layer electrically conductive strips to form a plurality of fully aligned vias (FAVs) between the first-layer electrically conductive strips and the second-layer electrically conductive strips.

12. The method of claim 11, wherein each FAV among the plurality of FAVs includes a first end that directly contacts an upper surface of a respective first-layer electrically conductive strip and an opposing second end that directly contacts a lower portion of a respective second-layer electrically conductive strip.

13. The method of claim 11, wherein the first-layer electrically conductive strips and the second-layer electrically conductive strips include a metal material selected from a group comprising of copper, tungsten, cobalt, rhodium, platinum, molybdenum, or combinations thereof.

14. The method of claim 11, wherein after recessing the first-layer electrically conductive strips, the second-layer electrically conductive strips have a first height extending from the second end of the FAVs to an upper surface of the respective second-layer electrically conductive strip and the first-layer electrically conductive strips have a second height extending from the substrate to the first end of the respective FAV, the second height being less than the first height.

15. The method of claim 12, wherein all sides of the FAVs are co-planar with opposing sides of the respective first-layer electrically conductive strip and the opposing sides of the respective second-layer electrically conductive strip such that the FAVs are fully aligned with the respective first-layer electrically conductive strip and the respective second-layer electrically conductive strip.

16. An interconnect structure comprising:
an interlayer dielectric (ILD) on a substrate, the ILD having a plurality of cavities extending therethrough along a first direction;
a plurality of first-layer electrically conductive strips, each first-layer electrically conductive strip formed on the substrate and within a respective cavity among the plurality of cavities, the plurality of first-layer electrically conductive strips extending along the first direction and across an upper surface of the substrate;
a plurality of second-layer electrically conductive strips on an upper surface of the ILD, the second-layer electrically conductive strips extending along a second direction opposite the first direction; and
a plurality of fully aligned vias (FAVs), each FAV extending between a respective first-layer electrically conductive strip and a respective second-layer electrically conductive strip,
wherein at least one of the first-layer electrically conductive strips includes a first recessed portion having a first etched upper surface, and a second recessed portion different from the first etched portion having a second etched upper surface that is covered by the ILD, and
wherein all sides of a given FAV among the plurality of FAVs are co-planar with opposing sides of the respective first-layer electrically conductive strip and opposing sides of the respective second-layer electrically conductive strip such that each FAV among the plurality of FAVs is fully aligned with the first and second-layer electrically conductive strips.

17. The interconnect structure of claim 16, wherein each the FAVs includes a first end that directly contacts an upper surface of the respective first-layer electrically conductive strip and an opposing second end that directly contacts a lower portion of the respective second-layer electrically conductive strip.

18. The interconnect structure of claim 16, wherein the plurality of first-layer and second-layer electrically conductive strips include a metal material selected from a group comprising of copper, tungsten, cobalt, rhodium, platinum, and combinations thereof.

19. The interconnect structure of claim 16, wherein at least one first-layer electrically conductive strip among the plurality of first-layer conductive strips has a first height extending from the substrate to the first end of a first FAV among the plurality of FAVs and at least one second first-layer electrically conductive strip among the plurality of first-layer electrically conductive strips has a second height extending from the substrate to the first end of a second FAV among the plurality of FAVs, the second height being different than the first height.

20. The interconnect structure of claim 17, wherein a first length of a given cavity extending from the ILD to a side of a respective FAV matches a second length of the first-layer electrically conductive strip that is disposed in the given cavity and that extends from the ILD to the side of the respective FAV.

21. An interconnect structure comprising:
an interlayer dielectric (ILD) on a substrate, the ILD having a plurality of cavities extending therethrough along a first direction;
a plurality of first-layer electrically conductive strips on the substrate, each first-layer electrically conductive strip located within a respective cavity among the plurality of cavities, and extending across an upper surface of the substrate along the first direction;
a plurality of second-layer electrically conductive strips on an upper surface of the ILD and extending along a second direction opposite the first direction; and
a plurality of fully aligned vias (FAVs), each FAV extending between a respective first-layer electrically conductive strip and a respective second-layer electrically conductive strip,
wherein the first-layer of electrically conductive strips includes at least one recessed electrically conductive strip having a step portion formed in the upper surface and adjacent to a given FAV contacting the upper surface of the at least one recessed electrically conductive strip.

22. The interconnect structure of claim 21, wherein the recessed electrically conductive strip includes a first upper surface located adjacent a first side of the given FAV and a second upper surface located on a second side of the given FAV opposite the first side, the first upper surface having a first height that is greater than a second height of the second upper surface.

23. The interconnect structure of claim 21, wherein all sides of each FAV among the plurality of FAVs are co-planar with opposing sides of the respective first-layer electrically conductive strip and opposing sides of the respective second-layer electrically conductive strip such that each FAV among the plurality of FAVs is fully aligned with the plurality of first-layer electrically conductive strips and the plurality of second-layer electrically conductive strips.

24. The interconnect structure of claim 22, wherein the step portion is located between the given FAV and the first upper surface.

25. The interconnect structure of claim 22, wherein the step portion is located between the given FAV and the second upper surface.

* * * * *